(12) United States Patent
Ujihara et al.

(10) Patent No.: US 11,345,640 B2
(45) Date of Patent: May 31, 2022

(54) METHOD AND APPARATUS FOR PRODUCING AlN WHISKERS, AlN WHISKER BODIES, AlN WHISKERS, RESIN MOLDED BODY, AND METHOD FOR PRODUCING RESIN MOLDED BODY

(71) Applicant: NATIONAL UNIVERSITY CORPORATION NAGOYA UNIVERSITY, Nagoya (JP)

(72) Inventors: Toru Ujihara, Nagoya (JP); Yukihisa Takeuchi, Nagoya (JP); Daishi Shiojiri, Nagoya (JP); Masaki Matsumoto, Nagoya (JP); Hiroshi Saito, Nagoya (JP); Ikuo Hayashi, Nagoya (JP)

(73) Assignee: NATIONAL UNIVERSITY CORPORATION NAGOYA UNIVERSITY, Nagoya (JP)

( * ) Notice: Subject to any disclaimer, the term of this patent is extended or adjusted under 35 U.S.C. 154(b) by 318 days.

(21) Appl. No.: 16/494,928

(22) PCT Filed: Mar. 16, 2018

(86) PCT No.: PCT/JP2018/010588
§ 371 (c)(1),
(2) Date: Sep. 17, 2019

(87) PCT Pub. No.: WO2018/169073
PCT Pub. Date: Sep. 20, 2018

(65) Prior Publication Data
US 2020/0095170 A1    Mar. 26, 2020

(30) Foreign Application Priority Data

Mar. 17, 2017 (JP) ............................. JP2017-053622
Mar. 17, 2017 (JP) ............................. JP2017-053623
Mar. 17, 2017 (JP) ............................. JP2017-053624

(51) Int. Cl.
C30B 29/38  (2006.01)
C04B 35/581 (2006.01)
C30B 29/62  (2006.01)

(52) U.S. Cl.
CPC ............ *C04B 35/581* (2013.01); *C30B 29/38* (2013.01); *C30B 29/62* (2013.01)

(58) Field of Classification Search
CPC ....... C30B 25/002; C30B 29/62; C30B 29/38; C04B 35/581
See application file for complete search history.

(56) References Cited

U.S. PATENT DOCUMENTS

| 2015/0183640 A1* | 7/2015 | Potemkin | ............ C01B 21/0722 423/412 |
| 2016/0108554 A1* | 4/2016 | Koukitsu | ............ H01L 21/0254 117/88 |
| 2017/0183553 A1* | 6/2017 | Ujihara | ............... C01B 21/0722 |

FOREIGN PATENT DOCUMENTS

| JP | S63-75000 A  | 4/1988 |
| JP | S64-65100 A  | 3/1989 |

(Continued)

*Primary Examiner* — Robert M Kunemund
(74) *Attorney, Agent, or Firm* — Oliff PLC

(57) ABSTRACT

A method and apparatus for producing AlN whiskers includes reduced incorporation of metal particles, an AlN whisker body, AlN whiskers, a resin molded body, and a method for producing the resin molded body. The method for producing AlN whiskers includes heating an Al-containing material in a material accommodation unit to thereby generate Al gas; and introducing the Al gas into a reaction chamber through a communication portion while introducing nitrogen gas into the reaction chamber through a gas inlet port, to thereby grow AlN whiskers on the surface of an $Al_2O_3$ substrate placed in the reaction chamber.

5 Claims, 17 Drawing Sheets

(56) References Cited

FOREIGN PATENT DOCUMENTS

| | | | |
|---|---|---|---|
| JP | H08-283456 | A | 10/1996 |
| JP | H08-337514 | A | 12/1996 |
| JP | 2001-122671 | A | 5/2001 |
| JP | 2014-073951 | A | 4/2014 |
| JP | 2016-145120 | A | 8/2016 |

* cited by examiner

METHOD AND APPARATUS FOR PRODUCING AlN WHISKERS, AlN WHISKER BODIES, AlN WHISKERS, RESIN MOLDED BODY, AND METHOD FOR PRODUCING RESIN MOLDED BODY

TECHNICAL FIELD

The technique disclosed in the present specification relates to a method and apparatus for producing AlN whiskers; as well as to an AlN whisker body; AlN whiskers; a resin molded body; and a method for producing the resin molded body.

BACKGROUND ART

In general, an electronic device generates heat during use. The generated heat may adversely affect the performance of the electronic device. Thus, the electronic device often includes a heat radiation member. Since the heat radiation member may be required to have insulation property, the electronic device may include an insulating substrate.

For example, an AlN substrate may be used as an insulating substrate. Although AlN has both high thermal conductivity and high insulation property, the toughness of an AlN substrate is insufficient for some applications. It is very rare for a material having both high thermal conductivity and high insulation property to be used in applications requiring sufficient brittle fracture strength.

Thus, some of the present inventors have researched and developed a method for producing AlN whiskers (Patent Document 1). AlN whiskers are a fibrous material, and have both high thermal conductivity and high insulation property. A composite material having various performances can be produced through solidification of a mixture of AlN whiskers and a resin material.

PRIOR ART DOCUMENT

Patent Document

Patent Document 1: Japanese Patent Application Laid-Open (kokai) No. 2014-073951

SUMMARY OF THE INVENTION

Problem to be Solved by the Invention

As described above, AlN whiskers are an insulating material. The conventional production method may cause a problem in that metal particles (e.g., Al particles) are incorporated into AlN whisker bundles during recovery of AlN whiskers. Incorporation of such impurities may impair the insulation property of AlN whiskers. Also, incorporation of impurities having different atomic radii into AlN crystals may cause crystal defects, resulting in a reduction in thermal conductivity.

The technique disclosed in the present specification has been accomplished for solving problems involved in the aforementioned conventional technique. Thus, objects of the technique disclosed in the present specification are to provide a method and apparatus for producing AlN whiskers with reduced incorporation of metal particles; an AlN whisker body; AlN whiskers; a resin molded body; and a method for producing the resin molded body.

Means for Solving the Problem

In a first aspect, there provided a method for producing AlN whiskers, comprising heating an Al-containing material in a first chamber to thereby generate Al gas; and introducing the Al gas into a second chamber through a first inlet port while introducing nitrogen gas into the second chamber through a second inlet port, to thereby grow AlN whiskers on the surface of an insulating substrate placed in the second chamber.

In the method for producing AlN whiskers, the first chamber for generating Al gas is provided separately from the second chamber for growing AlN whiskers, and AlN whiskers are grown on the insulating substrate placed in the second chamber. Thus, incorporation of other metal particles into the drown AlN whiskers is prevented during recovery of the AlN whiskers.

Advantageous Effects of the Invention

In the present specification, there are provided a method and apparatus for producing AlN whiskers with reduced incorporation of metal particles; an AlN whisker body; AlN whiskers; a resin molded body; and a method for producing the resin molded body.

MODES FOR CARRYING OUT THE INVENTION

Figure 1:
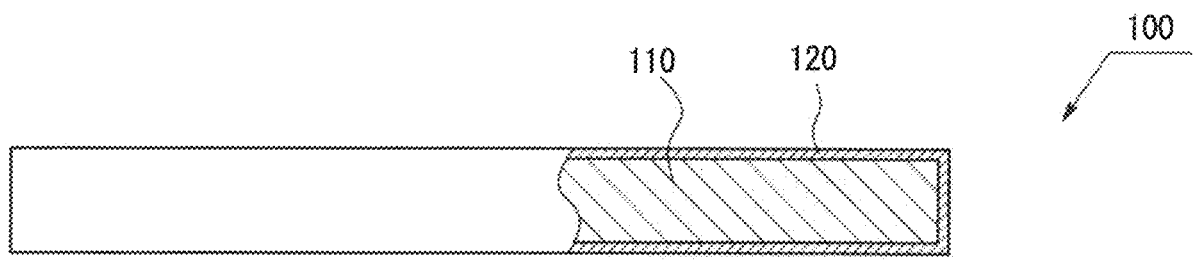
FIG. 1 A partial cross-sectional view of the structure of an AlN whisker according to a first embodiment.

Specific embodiments will next be described with reference to the drawings by taking, as examples, a method and apparatus for producing AlN whiskers, an AlN whisker body, AlN whiskers, a resin molded body, and a method for producing the resin molded body. The thickness proportion of each layer shown in the drawings does not correspond to its actual value.

First Embodiment

A first embodiment will now be described.

1. AlN Whisker

1-1. Structure of AlN Whisker

FIG. 1 is a partial cross-sectional view of the structure of an AlN whisker 100 of the present embodiment. As shown in FIG. 1, the AlN whisker 100 is a fibrous material. The AlN whisker 100 includes an AlN single crystal 110 and an oxygen atom-containing layer 120. The AlN single crystal 110 is in a fibrous form. The AlN single crystal 110 is located at the center of the AlN whisker 100. The AlN whisker 100 has a length of 1 μm to 5 cm. The AlN whisker 100 has a diameter of 0.1 μm to 50 μm. These numerical ranges are for reference only and are not necessarily limited thereto.

1-2. Oxygen Atom-Containing Layer

The oxygen atom-containing layer 120 is a first layer formed through incorporation of at least oxygen atoms into the AlN single crystal 110. Thus, needless to say, the oxygen atom-containing layer 120 contains oxygen atoms. The oxygen atom-containing layer 120 cylindrically covers the surface of the AlN single crystal 110. The oxygen atom-containing layer 120 has a cylindrical shape. The oxygen atom-containing layer 120 has a thickness of 7 nm to 500 nm. As described above, the oxygen atom-containing layer 120 is derived from the AlN single crystal 110. Thus, in the case where the AlN single crystal 110 has a sufficiently dense crystalline structure, the oxygen atom-containing layer 120 has a thickness of 7 nm to 10 nm. These numerical ranges are for reference only and are not necessarily limited thereto.

The oxygen atom-containing layer 120 is formed through reaction between the surface of the AlN single crystal 110 and oxygen molecules or water molecules contained in air. Thus, the oxygen atom-containing layer 120 is derived from a portion of the AlN single crystal 110. The reaction between AlN and oxygen molecules or water molecules may generate at least one of $Al_2O_3$, AlON, and $Al(OH)_3$. Therefore, the oxygen atom-containing layer 120 contains at least one of $Al_2O_3$, AlON, and $Al(OH)_3$. Alternatively, the oxygen atom-containing layer 120 may be formed of a composite material containing these compounds. Each of $Al_2O_3$, AlON, and $Al(OH)_3$ contains Al atom and an oxygen atom. The oxygen atom-containing la 120 has insulation property. The oxygen atom-containing layer 120 has a thermal conductivity lower than that of the AlN single crystal 110.

1-3. Properties of AlN Whisker of the Present Embodiment

The AlN whisker 100 has both high thermal conductivity and high insulation property. The AlN whisker 100 also has a sufficient brittle fracture strength. Thus, a composite material having various properties can be produced through solidification of a mixture of the AlN whisker 100 and a resin material.

As described above, the oxygen atom-containing layer 120 is derived from a portion of the AlN single crystal 110. Thus, the oxygen atom-containing layer 120 has a dense crystalline structure. Once the oxygen atom-containing layer 120 is formed, the oxygen atom-containing layer 120 prevents intrusion of oxygen molecules and water molecules. Thus, the oxygen atom-containing layer 120 effectively prevents oxidation of the AlN single crystal 110 inside of the layer 120. Since the oxygen atom-containing layer 120 has excellent crystallinity as described above, the oxygen atom-containing layer 120 achieves a very small thickness; i.e., the oxygen atom-containing layer 120 has a thickness as small as, for example, 7 nm to 10 nm. Thus, the AlN single crystal 110 accounts for a sufficiently large proportion of the volume of the AlN whisker 100; i.e., the AlN whisker 100 has very high thermal conductivity.

Such a dense oxygen atom-containing layer is difficult to form by use of a conventional AlN material. Thus, the conventional AlN material has a relatively thick oxide layer or hydroxide layer. The oxide layer of the AlN material does not have high thermal conductivity. In contrast, the AlN whisker 100 of the present embodiment has thermal conductivity superior to that of the conventional AlN material, since the oxygen atom-containing layer 120 has a small thickness.

2. AlN Whisker Production Apparatus

2-1. Structure of AlN Whisker Production Apparatus

Figure 2:
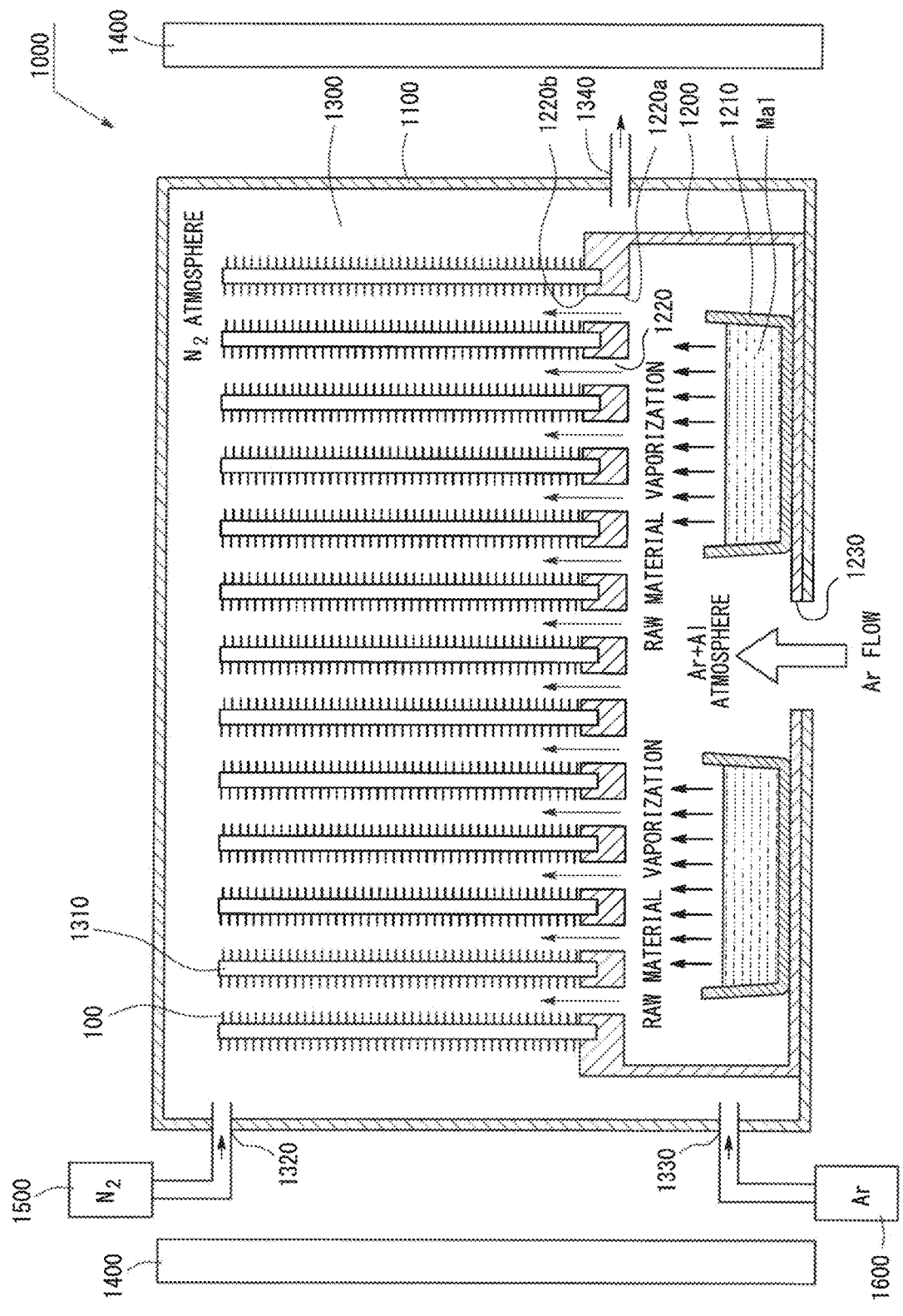
FIG. 2 A schematic illustration of the structure of an apparatus for producing AlN whiskers according to the first embodiment.

FIG. 2 is a schematic illustration of the structure of a production apparatus 1000 for producing AlN whiskers 100 of the present embodiment. The production apparatus 1000 includes a furnace body 1100, a heater 1400, a nitrogen gas supply unit 1500, and an argon gas supply unit 1600. The furnace body 1100 includes therein a material accommodation unit 1200 and a reaction chamber 1300. The furnace body 1100 is formed of, for example, carbon or quartz.

The material accommodation unit 1200 is a first chamber for accommodating an Al material and generating Al gas through vaporization of Al. The material accommodation unit 1200 is formed of, for example, carbon or quartz. The material accommodation unit 1200 has a container 1210, one or more communication portions 1220, and a gas inlet port 1230. The container 1210 is provided for accommodating an Al material. The container 1210 is formed of, for example, alumina. The gas inlet port 1230 is provided for introducing a rare gas (e.g., argon gas) into the material accommodation unit 1200.

The communication portions 1220 communicate between the material accommodation unit 1200 and the reaction chamber 1300; i.e., the communication portions 1220 are disposed between the material accommodation unit 1200 and the reaction chamber 1300. Each of the communication portions 1220 has an opening 1220a facing the material accommodation unit 1200 and an opening 1220b facing the reaction chamber 1300. The opening 1220b of the communication portion 1220 is a first inlet port for supplying Al gas generated in the material accommodation unit 1200 to the reaction chamber 1300.

The reaction chamber 1300 is a second chamber for reacting Al gas with nitrogen gas to thereby grow AlN whiskers 100. The reaction chamber 1300 has $Al_2O_3$ substrates 1310, gas inlet ports 1320 and 1330, and a gas outlet port 1340. The $Al_2O_3$ substrates 1310 are alumina substrates. The $Al_2O_3$ substrates 1310 are a type of insulating substrate. The reaction chamber 1300 includes therein a large number of arranged $Al_2O_3$ substrates 1310. Each of the $Al_2O_3$ substrates 1310 is provided for growing AlN whiskers 100 on its surface. The $Al_2O_3$ substrates 1310 are arranged such that the surfaces of the substrates are orthogonal to the horizontal direction. The gas inlet port 1320 is a second inlet port for introducing nitrogen gas into the reaction chamber 1300. The gas inlet port 1330 is provided for introducing argon gas into the reaction chamber 1300. The gas outlet port 1340 is provided for discharging gases from the reaction chamber 1300 to the outside of the production apparatus 1000.

The heater 1400 is provided for heating the interior of the furnace body 1100. The heater 1400 is a first heating unit for heating the material accommodation unit 1200. Thus, the heater 1400 is used for heating and vaporizing the Al material in the material accommodation unit 1200. The heater 1400 also heats the reaction chamber 1300. The heater 1400 increases the temperature in the reaction chamber 1300.

The nitrogen gas supply unit 1500 is provided for supplying nitrogen gas into the reaction chamber 1300 through the gas inlet port 1320. The argon gas supply unit 1600 is provided for supplying argon gas into the reaction chamber 1300 through the gas inlet port 1330. The argon gas supply unit 1600 may be used for supplying argon gas to the material accommodation unit 1200 through the gas inlet port 1230.

2-2. Effects of AlN Whisker Production Apparatus and Production Conditions

The reaction chamber 1300 is disposed above the material accommodation unit 1200; i.e., the material accommodation unit 1200 is disposed vertically below the reaction chamber 1300. Thus, Al gas generated in the material accommodation unit 1200 readily flows from the material accommodation unit 1200 toward the reaction chamber 1300 disposed above the unit 1200.

Since the heater 1400 simultaneously heats the material accommodation unit 1200 and the reaction chamber 1300, substantially no difference in temperature resides between the material accommodation unit 1200 and the reaction chamber 1300. The growth temperature of AlN whiskers 100 is 1,500° C. to 1,800° C. The substrate temperature is almost the same as the temperature of the atmosphere in the furnace. The internal pressures of the material accommodation unit 1200 and the reaction chamber 1300 are almost equal to atmospheric pressure. Preferably, the internal pressure of the material accommodation unit 1200 is slightly higher than that of the reaction chamber 1300. In such a case, nitrogen gas in the reaction chamber 1300 barely enters the material accommodation unit 1200. Thus, the surface of the molten Al material is barely nitrided.

3. Production Method for AlN Whiskers

3-1. Material Provision Step

Firstly, an Al material is accommodated in the container 1210 of the production apparatus 1000. The Al material is industrially smelted aluminum. In this step, the Al material is in the form of solid metal.

3-2. Vaporization Step (Al Gas Generation Step)

Subsequently, the Al material is heated in the material accommodation unit 1200, to thereby generate Al gas. For this purpose, the furnace body 1100 is heated by means of the heater 1400. This heating increases the temperatures in the material accommodation unit 1200 and the reaction chamber 1300. During heating of the material accommodation unit 1200, the argon gas supply unit 1600 supplies argon gas into the material accommodation unit 1200. When the temperature reaches the melting point of Al, the Al material starts to melt. Thereafter, a portion of the Al material starts to vaporize even at a temperature below the boiling point of Al; i.e., the Al material vaporizes to generate Al gas. Thus, the interior of the material accommodation unit 1200 is filled with a gas mixture of argon gas and Al gas.

3-3. AlN Single Crystal Formation Step (Gas Supply Step)

Subsequently, the gas mixture of argon gas and Al gas is caused to flow from the material accommodation unit 1200 into the reaction chamber 1300 through the openings 1220b of the communication portions 1220. In this case, the gas mixture of Al gas and argon gas is supplied into the reaction chamber 1300 in a direction almost parallel to the surfaces of the $Al_2O_3$ substrates 1310. Meanwhile, the argon gas supply unit 1600 supplies argon gas into the reaction chamber 1300 through the gas inlet port 1330. Preferably, Al gas is supplied to the $Al_2O_3$ substrates 1310 after the space around the $Al_2O_3$ substrates 1310 has been filled with Ar gas. The nitrogen gas supply unit 1500 supplies nitrogen gas into the reaction chamber 1300 through the gas inlet port 1320. Then, argon gas, Al gas, and nitrogen gas are mixed together in the reaction chamber 1300. Thus, Al gas reacts with nitrogen gas on the surfaces of the $Al_2O_3$ substrates 1310, to thereby grow fibrous AlN single crystals 110.

The growth temperature of the AlN single crystals 110 is 1,500° C. to 1,800° C. Thus, the atmosphere temperature in the reaction chamber 1300 is adjusted to 1,500° C. to 1,800° C. during growth of the AlN single crystals 110. Since the production time for the AlN single crystals 110 is sufficiently long, the substrate temperature is probably almost equal to the atmosphere temperature. Thus, the temperature of the $Al_2O_3$ substrates 1310 is 1,500° C. to 1,800° C. The internal pressure of the reaction chamber 1300 is almost 1 atm; i.e., the internal pressure falls within a range of 0.9 atm to 1.1 atm.

3-4. Oxygen Atom-Containing Layer Formation Step

Thereafter, the furnace temperature of the production apparatus 1000 is lowered to room temperature. The AlN single crystals 110 are then removed from the production apparatus 1000. During removal of the AlN single crystals 110 or temperature drop, the surfaces of the AlN single crystals 110 probably react with oxygen molecules or water molecules, to thereby form oxygen atom-containing layers 120. Thus, thin oxygen atom-containing layers 120 are formed on the surfaces of the AlN single crystals 110 removed from the production apparatus 1000.

4. Effects of the Present Embodiment

4-1. Purity of AlN Whiskers

The technique of the present embodiment does not involve the use of Ti or Si as a growth activator unlike the technique disclosed in Japanese Patent Application Laid-Open (kokai) No. 2014-073951. Since a metal catalyst is not used the present embodiment, metal aggregates are barely formed around AlN whiskers 100. Since the Al material used as a raw material has high-purity Al, virtually no impurities enter the AlN whiskers 100. Thus, the thus-produced AlN whiskers 100 have high purity. In the present embodiment, $Al_2O_3$ probably plays a catalyst-like role.

4-2. AlN Powder and Yield

Virtually no AlN powder enters the AlN whiskers 100. Thus, the yield of the AlN whiskers 100 relative to the raw material is very high.

4-3. Productivity of AlN Whiskers

In the present embodiment, the material accommodation unit 1200 is disposed separately from the reaction chamber 1300; i.e., Al gas and AlN are generated at different sites. In addition, the internal pressure of the material accommodation unit 1200 is higher than that of the reaction chamber 1300. Therefore, nitrogen gas barely enters the material accommodation unit 1200; hence, the surface of the molten Al material is barely nitrided. Thus, the Al material can be supplied to the reaction chamber 1300 over a long period of time. Consequently, long AlN whiskers 100 can be produced in the present embodiment.

In the conventional technique (see, for example, Japanese Patent Application Laid-Open (kokai) No. 2014-073951), AlN whiskers are generated at the surface of a molten material containing Al—Ti—Si as a main component; i.e., the growth site of AlN whiskers is limited to the surface of the molten material. Thus, the conventional technique requires a very large furnace for mass production of AlN whiskers.

In the present embodiment, AlN whiskers 100 are grown through reaction between Al gas and nitrogen gas on the surfaces of the $Al_2O_3$ substrates 1310. Thus, the growth site of AlN whiskers 100 is not necessarily limited to the surface (horizontal surface) of the molten material. Therefore, a large amount of AlN whiskers 100 can be produced on the surfaces or a large number of $Al_2O_3$ substrates 1310 disposed orthogonal to the horizontal surface by means of a relatively small furnace.

5. Modifications

5-1. Shutter of Opening

The communication portions 1220 are located between the material accommodation unit 1200 and the reaction chamber 1300. The opening 1220a or 1220b of each communication portion 1220 may be provided with an openable and closable shutter. The shutter is a unit for switching the open state and the closed state of the opening 1220a or 1220b. The shutter can control the timing of flow of Al gas into the reaction chamber 1300.

5-2. Heating Unit

As shown in FIG. 2, the material accommodation unit 1200 is disposed in the interior of the furnace body 1100. However, the material accommodation unit 1200 and the reaction chamber 1300 may be provided as independent units. In such a case, the production apparatus 1000 includes a first heating unit for heating the material accommodation unit 1200 and a second heating unit for heating the reaction chamber 1300. Thus, the material accommodation unit 1200 and the reaction chamber 1300 can be separately heated. Therefore, the temperature for vaporizing the Al material can be adjusted separately from the furnace temperature of the reaction chamber 1300.

5-3. Insulating Substrate

The $Al_2O_3$ substrate 1310 used in the present embodiment is an alumina substrate. The $Al_2O_3$ substrate 1310 may be a sapphire substrate. Thus, examples of the $Al_2O_3$ substrate include an alumina substrate and a sapphire substrate. The insulating substrate may be an AlN polycrystalline substrate.

5-4. Al-Containing Material

The Al material used in the present embodiment is industrially refined aluminum. However, an Al alloy may be used instead of such a high-purity Al material. AlN whiskers 100 can be produced even if such an Al atom-containing material is used. However, the use of industrially refined aluminum can reduce incorporation of impurities into the produced AlN whiskers 100.

5-5. Combination

The aforementioned modifications may be combined in any manner.

6. Summary of the Present Embodiment

In the production method for the AlN whiskers 100 of the present embodiment, Al gas is generated in the material accommodation unit 1200, and Al gas is mixed with nitrogen gas in the reaction chamber 1300, to thereby-grow the AlN whiskers 100 on the surfaces of the $Al_2O_3$ substrates 1310. Thus, the AlN whiskers 100 are produced.

The AlN whiskers 100 of the present embodiment have a very high purity. Since Ti or Si is not used as a catalyst, the AlN whiskers 100 contain virtually no impurities. Virtually no AlN powder is generated during the production process.

Second Embodiment

A second embodiment will now be described.

1. AlN Whisker Body

Figure 3:
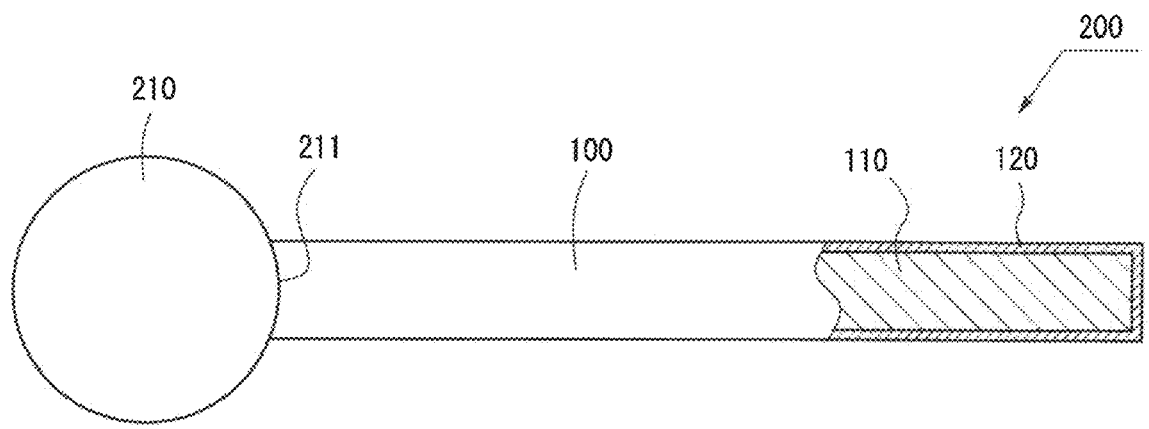
FIG. 3 A partial cross-sectional view of the structure of an AlN whisker body according to a second embodiment.

FIG. 3 is a partial cross-sectional view of the structure of an AlN whisker body 200 of the present embodiment. The AlN whisker body 200 includes an AlN whisker 100 and an AlN particle 210. The AlN whisker 100 is bonded to the surface 211 of the AlN particle 210. Thus, in the AlN whisker body 200, the AlN whisker 100 is integrated with the AlN particle 210. The AlN particle 210 has a size of about 0.2 μm to about 10 mm.

2. Production Method for AlN Whisker Body

The production method for the AlN whisker body 200 is almost the same as the production method for the AlN whiskers 100 of the first embodiment. Thus, differences between these methods will now be described.

2-1. AlN Particle Provision Step

Figure 4:
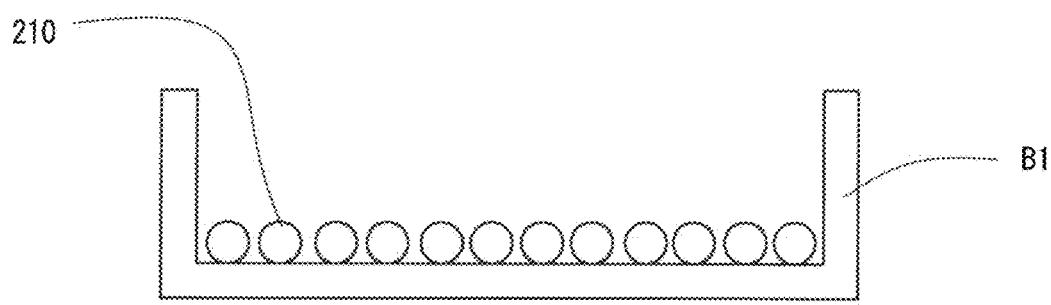
FIG. 4 An explanatory view showing a method for producing AlN whisker bodies according to the second embodiment (part 1).

FIG. 4 shows an AlN particle accommodation unit B1 accommodating AlN particles 210. In the present embodiment, the AlN particles 210 are accommodated in the AlN particle accommodation unit B1 as shown in FIG. 4. The reaction chamber 1300 includes therein the AlN particle accommodation unit B1 instead of the $Al_2O_3$ substrates 1310. Thus, the AlN particles 210 are used as insulating substrates in the present embodiment.

2-2. Material Provision Step

An Al material is accommodated in the container 1210 of the production apparatus 1000.

2-3. Vaporization Step (Al Gas Generation Step)

This step is performed in the same manner as the vaporization step of the first embodiment.

2-4. AlN Single Crystal Formation Step (Gas Supply Step)

This step is performed in the same manner as the AlN single crystal formation step of the first embodiment.

2-5. Oxygen Atom-Containing Layer Formation Step

Figure 5:
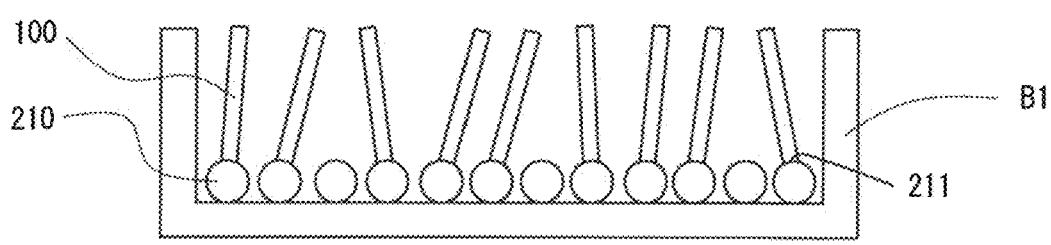
FIG. 5 An explanatory view showing the method for producing AlN whisker bodies according to the second embodiment (part 2).

This step is performed in the same manner as the oxygen atom-containing layer formation step of the first embodiment. Thus, as shown in FIG. 5, AlN whiskers 100 are grown on the surfaces 211 of the AlN particles 210.

3. Effects of the Present Embodiment

The AlN whisker body 200 of the present embodiment includes the AlN whisker 100 and the AlN particle 210. The AlN whisker body 200 has the center of gravity in the vicinity of the AlN particle 210. Thus, a resin containing the AlN whisker body 200 is readily formed into a flat molded bodiesuch that the AlN particle 210 side of the AlN whisker body 200 is located at a first surface (front surface) and the AlN whisker 100 side of the AlN whisker body 200 is located at a second surface (back surface). This process can produce a resin molded body wherein a thermal conduction path extends between the front surface and the back surface.

4. Modifications 4-1. Insulating Substrate

The insulating substrate may be $Al_2O_3$ particles instead of AlN particles. As described in the first embodiment and its modifications, the insulating substrate may be any of an $Al_2O_3$ substrate, an AlN polycrystalline substrate, AlN particles, and $Al_2O_3$ particles. Thus, the insulating substrate may be composed of an Al atom-containing material.

4-2. Insulating Substrate Covering Carbon Substrate

The insulating substrate may cover a carbon substrate. For example, at least one of AlN polycrystals and AlN particles may be formed on the carbon substrate. In such a case, the AlN whisker body includes the carbon substrate, the AlN polycrystal or AlN particle formed on the surface of the carbon substrate, and an AlN whisker bonded to the surface of the AlN polycrystal or the AlN.

The AlN polycrystal or AlN particle on the carbon substrate can be formed by means of vapor deposition, sputtering, or MOCVD. When the AlN whisker production process is repeated while the carbon substrate is placed in the production apparatus 1000, AlN polycrystals or AlN particles are formed on the carbon substrate. Thus, the insulating substrate covering the carbon substrate may be synthesized during the AlN whisker production process.

The carbon substrate has excellent thermal resistance. The surface of the carbon substrate is thoroughly covered with AlN polycrystals or AlN particles. AlC is probably formed at the interface between the carbon substrate and the AlN polycrystals or the AlN particles. Thus, strong bonding is achieved between the carbon substrate and the AlN polycrystals or the AlN particles. Therefore, incorporation of carbon into AlN whiskers can be prevented during recovery of the AlN whiskers.

4-3. Combination

The aforementioned modifications may be combined in any manner.

Third Embodiment

A third embodiment will now be described.

1. AlN Whisker

1-1. Structure of AlN Whisker

Figure 6:
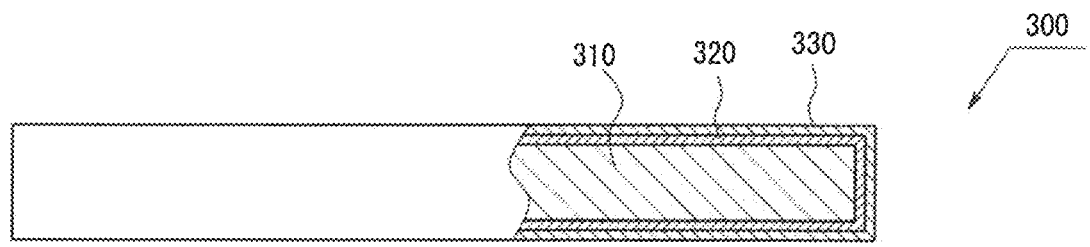
FIG. 6 A partial cross-sectional view of the structure an AlN whisker according to a third embodiment.

FIG. 6 is a partial cross-sectional view of the structure of an AlN whisker 300 of the present embodiment. As shown in FIG. 6, the AlN whisker 300 is a fibrous material. The AlN whisker 300 includes an AlN single crystal 310, an oxygen atom-containing layer 320, and a hydrophobic layer 330. The AlN single crystal 310 is in a fibrous form. The AlN whisker 300 has a length of 1 μm to 5 cm. The AlN whisker 300 has a diameter of 0.1 μm to 50 μm. These numerical ranges are for reference only and are not necessarily limited thereto.

1-2. Oxygen Atom-Containing Layer

The oxygen atom-containing layer 320 is a first layer formed through incorporation of at least oxygen atoms into the AlN single crystal 310. The oxygen atom-containing layer 320 cylindrically covers the surface of the AlN single crystal 310. The oxygen atom-containing layer 320 has a cylindrical shape. The oxygen atom-containing layer 320 has a thickness of 7 nm to 500 nm. As described above, the oxygen atom-containing layer 320 is derived from the AlN single crystal 310. Thus, when the AlN single crystal 310 has a sufficiently dense crystalline structure, the oxygen atom-containing layer 320 has a thickness of 7 nm to 10 nm. These numerical ranges are for reference only and are not necessarily limited thereto.

The oxygen atom-containing layer 320 is formed through reaction between the surface of the AlN single crystal 310 and oxygen molecules or water molecules contained in air. Thus, the oxygen atom-containing layer 320 is derived from a portion of the AlN single crystal 310. The reaction between AlN and oxygen molecules or water molecules may generate at least one of $Al_2O_3$, AlON, and $Al(OH)_3$. Therefore, the oxygen atom-containing layer 320 contains at least one of $Al_2O_3$, AlON, and $Al(OH)_3$. Alternatively, the oxygen atom-containing layer 320 may be formed of a composite material containing these compounds. Each of $Al_2O_3$, AlON, and $Al(OH)_3$ contains an Al atom and an oxygen atom. The oxygen atom-containing layer 320 has insulation property. The oxygen atom-containing layer 320 has a thermal conductivity lower than that of the AlN single crystal 310.

1-3. Hydrophobic Layer

The hydrophobic layer 330 is a second layer exhibiting hydrophobicity. The hydrophobic layer 330 is the outermost layer of the AlN whisker 300. The hydrophobic layer 330 cylindrically covers the surface of the oxygen atom-containing layer 320. The hydrophobic layer 330 has a cylindrical shape. The hydrophobic layer 330 has a thickness of, for example, 1 nm to 50 nm.

The hydrophobic layer 330 has hydrocarbon groups. Al atoms of the oxygen atom-containing layer 320 are bonded via an ester bond to hydrocarbon groups of the hydrophobic layer 330. The hydrophobic layer 330 is formed through bonding of a fatty acid to at least one of $Al_2O_3$, AlON, and $Al(OH)_3$ contained in the oxygen atom-containing layer 320. Examples of the fatty acid include a saturated fatty acid and an unsaturated fatty acid. Examples of the saturated fatty acid include stearic acid. Thus, the "hydrocarbon group" as used herein consists of a carbon atom(s) and a hydrogen atom(s). The hydrocarbon group contains any number of carbon atoms. The hydrophobic layer 330 has insulating property. The hydrophobic layer 330 has a thermal conductivity lower than that of the AlN single crystal 310.

Figure 7:
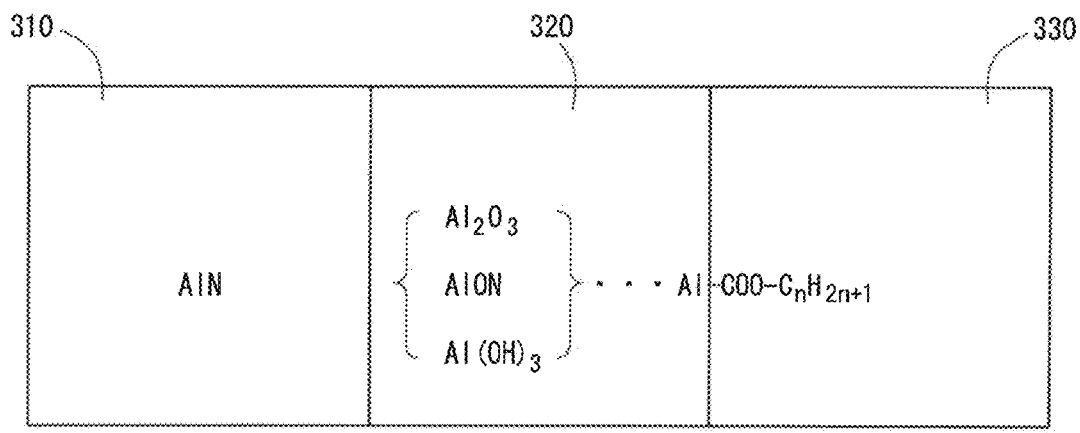
FIG. 7 A schematic illustration of the internal structure of the AlN whisker according to the third embodiment.

FIG. 7 is a schematic illustration of the internal structure of the AlN whisker 300 of the present embodiment. As shown in FIG. 7, the oxygen atom-containing layer 320 is disposed outside of the AlN single crystal 310, and the hydrophobic layer 330 is disposed outside of the oxygen atom-containing layer 320 and has hydrocarbon groups bonded via an ester bond to the oxygen atom-containing layer 320. The oxygen atom-containing layer 320 bonded via an ester bond to the hydrophobic layer 330 contains any of $Al_2O_3$, AlON, and $Al(OH)_3$.

1-4. Properties of AlN Whisker of the Present Embodiment

The AlN whisker 300 has both high thermal conductivity and high insulation property. The AlN whisker 300 also has sufficient brittle fracture strength. The hydrophobic layer 330 is readily bonded to a resin material; i.e., the hydrophobic layer 330 achieves sufficiently high adhesion to a resin material. Thus, when the AlN whisker 300 is mixed with a resin material and the mixture is solidified, the resultant composite material can achieve high adhesion between the AlN whisker 300 and the resin material.

As described above, the oxygen atom-containing layer 320 is derived from a portion of the AlN single crystal 310. Thus, the oxygen atom-containing layer 320 has a dense crystalline structure. Once the oxygen atom-containing layer 320 is formed, the oxygen atom-containing layer 320 prevents intrusion of oxygen molecules and water molecules. Thus, the oxygen atom-containing layer 320 has a thickness as small as, for example, 7 nm to 10 nm. Therefore, the AlN single crystal 310 accounts for a sufficiently large proportion of the volume of the AlN whisker 300; i.e., the AlN whisker 300 has very high thermal conductivity.

Such a dense oxygen atom-containing layer is difficult to form in a conventional AlN material. Thus, the conventional AlN material includes a relatively thick oxide layer (or hydroxide layer) Since the oxygen atom-containing layer 320 having low thermal conductivity has a small thickness in the present embodiment, the AlN whisker 300 of the present embodiment has thermal conductivity superior to that of the conventional AlN material.

2. Production Method for AlN Whiskers

2-1. Material Provision Step

This step is performed in the same manner as the material provision step of the first embodiment.

2-2. Vaporization Step (Al Gas Generation Step)

This step is performed in the same manner as the vaporization step of the first embodiment.

2-3. AlN Single Crystal Formation Step (Gas Supply Step)

This step is performed in the same manner as the AlN single crystal formation step of the first embodiment.

2-4. Oxygen Atom-Containing Layer Formation Step

This step is performed in the same manner as the oxygen atom-containing layer formation step of the first embodiment.

2-5. Hydrophobic Layer Formation Step (Surface Treatment Step)

Subsequently, the hydrophobic layer 330 (hydrocarbon groups) is formed on the surface of the oxygen atom-containing layer 320. For formation of the hydrocarbon groups, the AlN single crystal 310 having the oxygen atom-containing layer 320 is mixed with stearic acid and cyclohexane. The resultant mixture is heated to the boiling point of the solvent and then refluxed. Subsequently, the mixture is cooled to 40° C. and then subjected to filtration. Thereafter, the resultant product is washed with cyclohexane, followed by drying under reduced pressure, to thereby form the hydrophobic layer 330 on the surface of the oxygen atom-containing layer 320.

3. Effects of the Present Embodiment

3-1. Effects of Hydrophobic Layer

The AlN whisker 300 of the present embodiment includes the hydrophobic layer 330 disposed outside of the oxygen atom-containing layer 320. The hydrophobic layer 330 is formed through hydrophobization treatment of the surface of the oxygen atom-containing layer 320. The hydrophobic layer 330 readily adheres to a resin material. Thus, when the AlN whisker 300 of the present embodiment is mixed with a resin material and the mixture is solidified, virtually no gaps are generated around the AlN whisker 300.

3-2. Purity of AlN Whiskers

The technique of the present embodiment does not involve the use of Ti or Si as a growth activator unlike the technique disclosed in Japanese Patent Application Laid-Open (kokai) No. 2014-073951. Since a metal catalyst is not used in the present embodiment, metal aggregates are barely formed around AlN whiskers 300. Since the Al material used as a raw material has high-purity Al, virtually no impurities enter the AlN whiskers 300. Thus, the thus-produced AlN whiskers 300 have high purity. In the present embodiment, $Al_2O_3$ probably plays a catalyst-like role.

3-3. AlN Powder and Yield

Virtually no AlN powder enters the AlN whiskers 300. Thus, the yield of the AlN whiskers 300 relative to the raw material is very high.

3-4. Productivity of AlN Whiskers

In the present embodiment, the material accommodation unit 1200 is disposed separately from the reaction chamber 1300; i.e., Al gas and AlN are generated at different sites. In addition, the internal pressure of the material accommodation unit 1200 is higher than that of the reaction chamber 1300. Therefore, nitrogen gas barely enters the material accommodation unit 1200; hence, the surface of the molten Al material is barely nitrided. Thus, the Al material can be supplied to the reaction chamber 1300 over a long period of time. Consequently, long AlN whiskers 300 can be produced in the present embodiment.

In the conventional technique (see, for example, Japanese Patent Application Laid-Open (kokai) No. 2014-073951), AlN whiskers are generated at the surface of a molten material containing Al—Ti—Si as a main component; i.e., the growth site of AlN whiskers is limited to the surface of the molten material. Thus, the conventional technique requires a very large furnace for mass production of AlN whiskers.

In the present embodiment, AlN whiskers are grown through reaction between Al gas and nitrogen gas on the surfaces of the $Al_2O_3$ substrates 1310. Thus, the growth site of AlN whiskers is not necessarily limited to the surface (horizontal surface) of the molten material. Therefore, a large amount of AlN whiskers can be produced on the surfaces of a large number of $Al_2O_3$ substrates 1310 by means of a relatively small furnace.

4. Modifications

4-1. Oxygen Atom-Containing Layer

The oxygen atom-containing layer 320 contains at east one of $Al_2O_3$, AlON, and $Al(OH)_3$. However, the oxygen atom-containing layer 320 may contain an oxygen atom-containing Al compound other than the aforementioned Al compounds. Thus, the oxygen atom-containing layer 320 is a layer containing an Al atom and an oxygen atom.

5. Summary of the Present Embodiment

The AlN whisker 300 of the present embodiment includes the AlN single crystal 310, the oxygen atom-containing layer 320, and the hydrophobic layer 330. Since the hydrophobic layer 330 has hydrocarbon groups, the AlN whisker 300 has high adhesion to a resin material. Thus, a mixture of the AlN whisker 300 of the present embodiment and a resin material can be formed into a composite material having excellent thermal conductivity.

Fourth Embodiment

A fourth embodiment will now be described. The fourth embodiment corresponds to a resin molded body produced through molding of a resin in which fibrous AlN whiskers are aligned in one direction, and a method for producing the resin molded body.

1. Resin Molded Body

Figure 8:
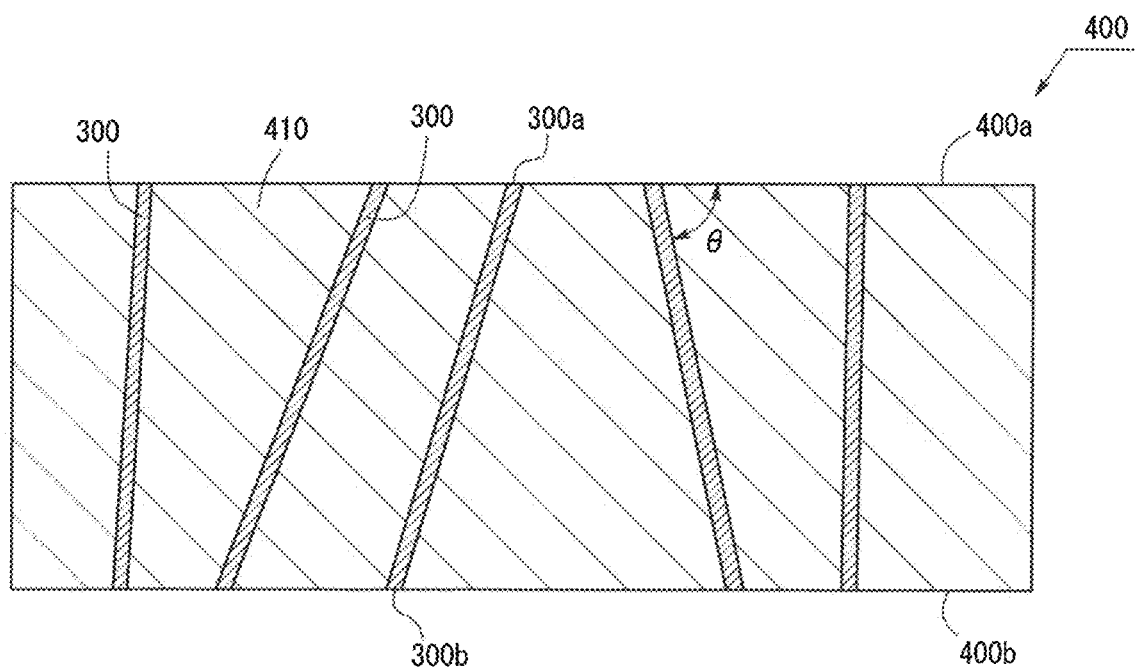
FIG. 8 A cross-sectional view of the structure of a resin molded body according to a fourth embodiment.

FIG. 8 shows the internal structure of a resin molded body 400 of the present embodiment. The resin molded body 400 contains AlN whiskers 300 of the third embodiment and a resin 410. Each of the AlN whiskers 300 has a first end 300a and a second end 300b. The resin 410 is a resin material covering the AlN whiskers 300. Thus, gaps between the AlN whiskers 300 are filled with the resin 410. The resin molded body 400 has a first surface 400a and a second surface 400b. The second surface 400b is opposite the first surface 400a.

As shown in FIG. 8, the AlN whiskers 300 extend between the first surface 400a and the second surface 400b in the resin molded body 400. That is, the first ends 300a of the AlN whiskers 300 are exposed at the first surface 400a, and the second ends 300b of the AlN whiskers 300 are exposed at the second surface 400b. Thus, the AlN whiskers 300 penetrate through the resin molded body 400 between the first surface 400a and the second surface 400b.

The AlN whiskers 300 form thermal conduction paths between the first surface 400a and the second surface 400b. In the resin molded body 400, the thermal conduction paths are present at high density. Thus, heat is effectively conducted from the first surface 400a to the second surface 400b. Gaps between the AlN whiskers 300 are filled with the resin 410. Since the resin 410 has a thermal conductivity lower than AlN, heat is less likely to diffuse in the planar direction of the resin molded body 400.

The AlN whiskers 300 are not necessarily disposed perpendicular to the surfaces of the resin molded body 400. As shown in FIG. 8, the angle $\theta$ between the axial direction of the AlN whiskers 300 and the first surface 400a is 60° to 120° in the resin molded body 400. The angle $\theta$ is preferably 75° to 105°. Needless to say, the angle $\theta$ is preferably 90°.

FIG. 8 shows a small number of AlN whiskers 300 for the sake of clarity. In actuality, the AlN whiskers 300 are present at much higher density.

2. AlN Whisker Alignment Apparatus

Figure 9:
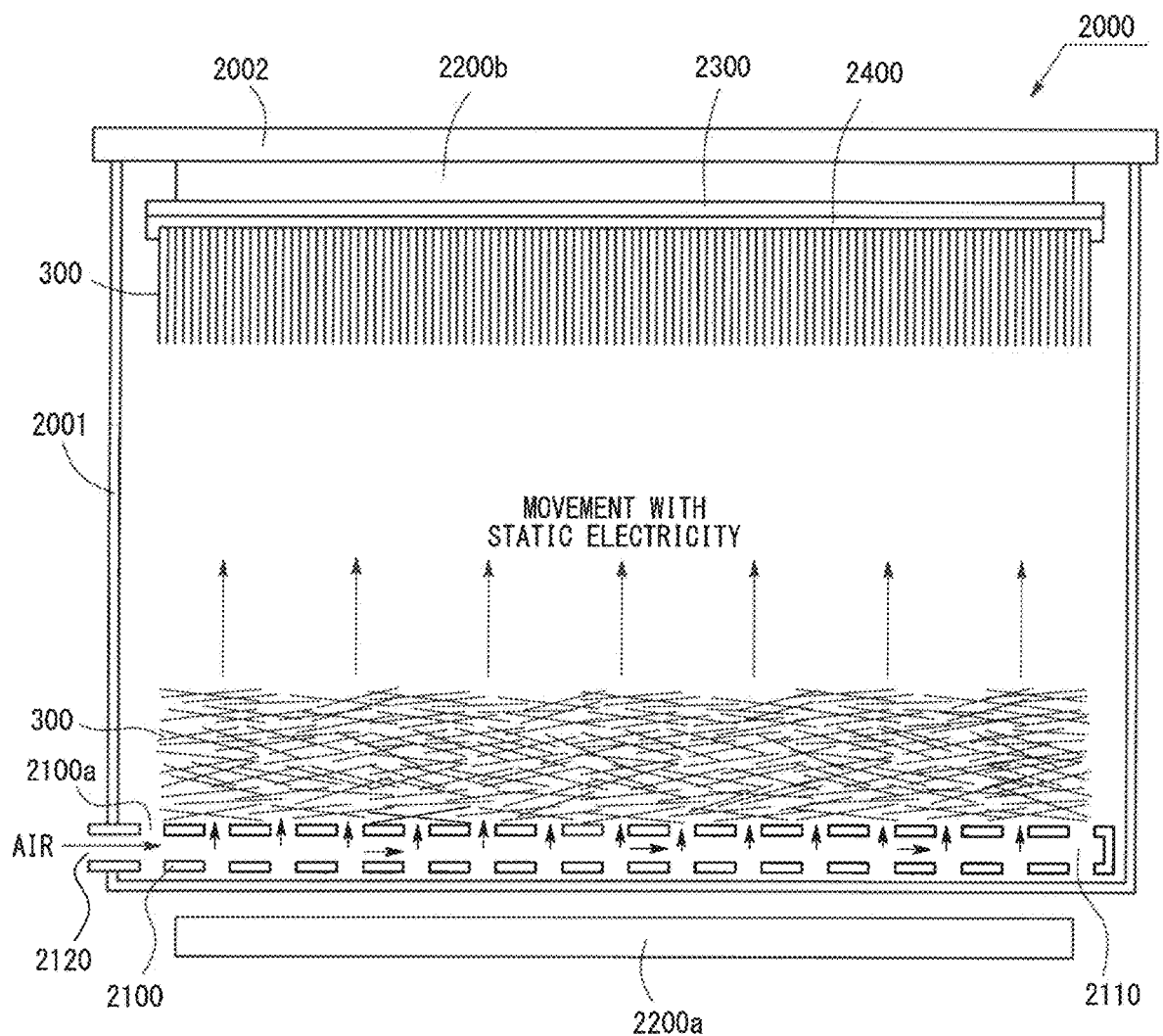
FIG. 9 A schematic illustration of the structure of an apparatus for aligning AlN whiskers according to the fourth embodiment.

FIG. 9 shows an alignment apparatus 2000 for aligning AlN whiskers 300 of the present embodiment. As shown in FIG. 9, the alignment apparatus 2000 is used for aligning bundles of AlN whiskers 300 entangled and extending in different directions. The alignment apparatus 2000 has a container 2001, a lid 2002, an AlN whisker placement unit 2100, a flow channel 2110, an air inlet port 2120, electrodes 2200a and 2200b, and a tape 2300.

The container 2001 has the lN whisker placement unit 2100, the flow channel 2110, and the air inlet port 2120. The lid 2002 is provided for temporarily sealing the container 2001. The electrode 2200b and the tape 2300 are fixed to the lid 2002.

The AlN whisker placement unit 2100 is provided for placing the AlN whiskers 300 in the initial state. The AlN whiskers 300 in the initial state are entangled and extend in different directions. The AlN whisker placement unit 2100 has through holes 2100a. The through holes 2100a are provided for ejecting air flowing through the flow channel 2110 from the AlN whisker placement unit 2100 toward the lid 2002.

The flow channel 2110 is located vertically below the AlN whisker placement unit 2100 and is provided for causing air to flow therethrough. The air inlet port 2120 is provided for introducing air into the flow channel 2110.

The electrodes 2200a and 2200b are disposed such that the AlN whisker placement unit 2100 is located therebetween. The electrode 2200a is disposed outside and below the container 2001. The AlN whiskers 300 can be flown from the AlN whisker placement unit 2100 toward the electrode 2200b by application of voltage between the electrodes 2200a and 2200b.

The tape 2300 is provided for bonding the flown AlN whiskers 300 thereto. An adhesive 2400 is applied to the surface of the tape 2300 facing the AlN whisker placement unit 2100 for effectively bonding the flown AlN whiskers 300 to the tape 2300.

3. AlN Whisker Alignment Method

3-1. Dispersion Step

Firstly, bundles of AlN whiskers 300 are placed on the AlN whisker placement unit 2100 of the alignment apparatus 2000. In this step, numerous AlN whiskers 300 are entangled with one another. Subsequently, air is supplied through the air inlet port 2120, whereby air is ejected via the through holes 2100a toward the lid 2002. Thus, AlN whiskers 300 temporarily fly in the air. The bundles of AlN whiskers 300 are loosened by repetition of air supply and interruption of air supply.

3-2. Voltage Application Step

Subsequently, DC voltage is applied between the electrodes 2200a and 2200b. This generates an electric field at the AlN whiskers 300, and in the vicinity thereof. Since the AlN whiskers 300 are electrostatically charged, the AlN whiskers 300 fly in the air by means of the electric field. Then, the first ends 300a of the AlN whiskers 300 adhere to the tape 2300. Thereafter, application of the voltage between the electrodes 2200a and 2200b is terminated.

In this step, some of the AlN whiskers 300 adhere to the tape 2300. However, the density of the AlN whiskers 300 adhering to the tape 2300 is relatively low. Therefore, application of DC voltage between the electrodes 2200a and 2200b and termination of the voltage application are repeated a plurality of times, to thereby increase the density of the AlN whiskers 300 adhering to the tape 2300. After the AlN whiskers 300 have been bonded to the tape 2300 at high density, the AlN whiskers 300 adhering to the tape 2300 are removed from the apparatus.

In some cases, air may be introduced through the air inlet port 2120 during application of DC voltage between the electrodes 2200a and 2200b, so that the AlN whiskers 300 are efficiently bonded to the tape 2300.

4. Resin Molding Method

Subsequently, a resin is molded while the AlN whiskers 300 are aligned upright.

4-1. AlN Whisker Provision Step

Figure 10:
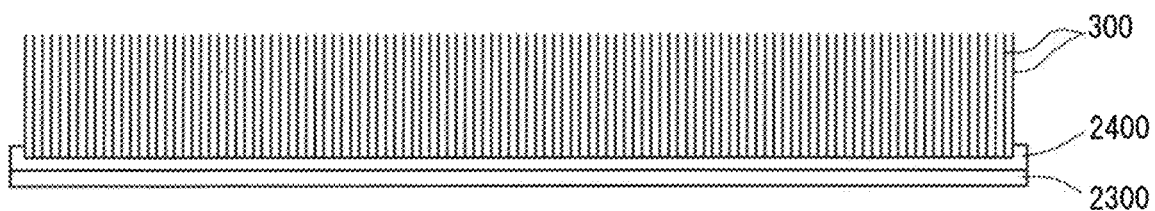
FIG. 10 An explanatory view showing a method for producing the resin molded body according to the fourth embodiment (part 1).

As shown in FIG. 10, there are firstly provided the AlN whiskers 300 whose first ends 300a adhere to the tape 2300. As shown in FIG. 10, the tape 2300 is located below the AlN whiskers 300. The tape 2300 may be located above the Al whiskers 300.

4-2. Resin Impregnation Step

Figure 11:
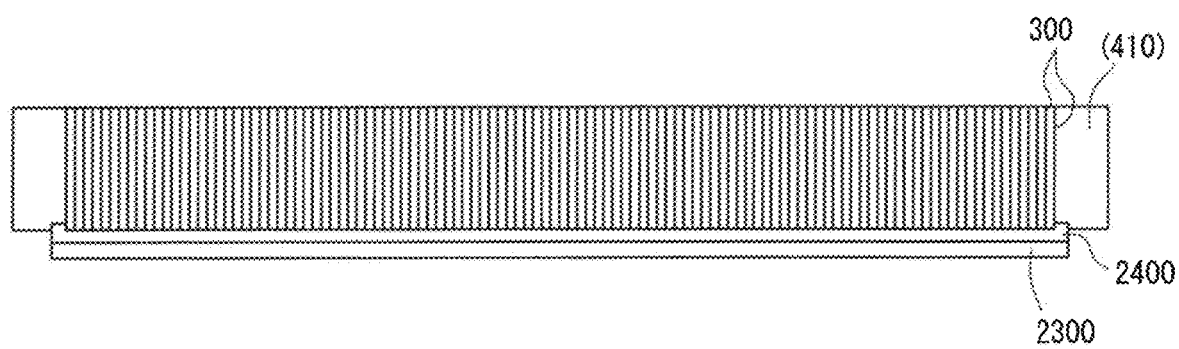
FIG. 11 An explanatory view showing the method for producing the resin molded body according to the fourth embodiment (part 2).

Subsequently, as shown in FIG. 11, a resin added to gaps between the AlN whiskers 300 aligned upright. Thus, while the first ends 300a of the AlN whiskers 300 adhere to the tape 2300, the AlN whiskers 300 are impregnated with a liquid-form resin, whereby the gaps between the AlN whiskers 300 are filled with the resin. The resin is then solidified.

4-3. Tape Removal Step

Figure 12:
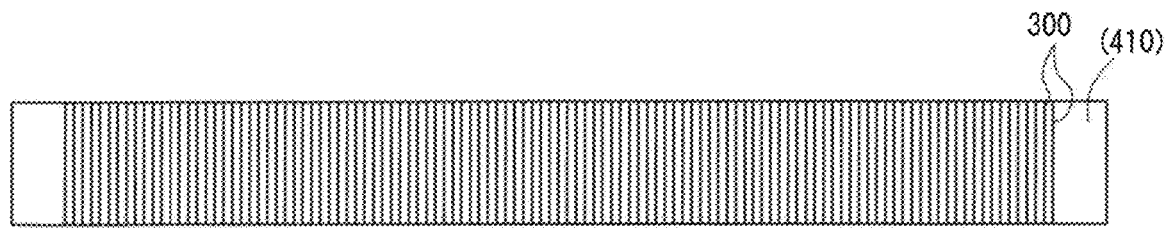
FIG. 12 An explanatory view showing the method for producing the resin molded body according to the fourth embodiment (part 3).

Subsequently, as shown in FIG. 12, the tape 2300 is removed from the upright AlN whiskers 300 contained in the solidified resin. That is, the tape 2300 is removed from the first ends 300a of the AlN whiskers 300.

5. Tape and Resin Materials

5-1. Tape Material

Examples of the material of the tape 2300 include foamed tape, polyolefin tape, acrylic tape, heat-resistant polyimide, heat-resistant insulating Nomex, glass cloth tape, high-strength and high-insulation PPS base, PP base, polyester tape, and fluororesin tape. Examples of the adhesive 2400 include rubber adhesive, acrylic adhesive, silicone adhesive, and urethane adhesive.

5-2. Resin Material

Examples of the usable resin include thermosetting reins, such as silicone resin (SI), epoxy resin (EP), phenolic resin (PF), melamine resin (MF), urea resin (UF), thermosetting polyimide (PI), unsaturated polyester resin (FRP) glass fiber reinforced plastic (FRP), and polyurethane (PU).

Other examples of the usable resin include thermoplastic resins, such as polyethylene (PE), polypropylene (PP), polystyrene (PS), polyvinyl chloride (PVC), polyvinylidene chloride (PVDC), polyvinyl acetate (PBAc), acrylonitrile-styrene copolymer (AS), acrylonitrile-butadiene-styrene copolymer (ABS), acrylonitrile-ethylene-propylene-diene-styrene copolymer (AES), and methacrylic resin (PMMA).

Other examples of the usable resin include fluororesins, such as polytetrafluoroethylene (PTFE), polychlorotrifluoroethylene (PCTFE), polyvinylidene fluoride (PVDF), and polyvinyl fluoride (PVF).

Other examples of the usable resin include polycarbonate (PC), polyamide resin (PA), polyacetal (POM), polyethylene terephthalate (PET), polybutylene terephthalate (PET), polyether ether ketone (PEEK), polyphenylene sulfide (PPS), polysulfone (PSF), polyether imide (PEI), polyamide imide (PAI), thermoplastic polyimide (PI), and liquid crystal polymer (LCP).

Other examples of the resin include acrylonitrile styrene acrylate (ASA), atactic polypropylene (APP), cellulose acetate (CA), cellulose acetate butyrate (CAB), chlorinated vinyl chloride (CPVC), chloroprene rubber (CR), diallyl phthalate (DAP), ethylene ethyl acrylate (EEA), ethylene-propylene-diene terpolymer (EPDM), ethylene-tetrafluoroethylene copolymer (ETFE), ethylene-vinyl acetate copolymer (EVA), ethyl vinyl ether (EVE), ethylene-vinyl alcohol copolymer (EVOH), perfluoro rubber, tetrafluoroethylene-hexafluoropropylene copolymer (FEP), and soft urethane foam (FPF).

Other examples of the resin include glass fiber reinforced plastic (FRP), glass fiber reinforced thermoplastic plastic (FRTP), butyl rubber (IIR), ionomer (IO), isoprene rubber (IR), melamine formaldehyde (MF), methyl methacrylate (MMA), nitrile rubber (NBR), natural rubber (NR), polyacrylic acid (PAA), polyallyl ether ketone (PAEK), polyester alkyd resin (PAK), polyacrylonitrile (PAN), and polyarylate (PAR).

Other examples of the resin include polyparaphenylene benzobisoxazole (PBO), polybutadiene styrene (PBS), polycarbonate (PC), diallyl terephthalate (DAP), polydicyclopentadiene (PDCPD), polyethylene naphthalate (PEN), polyethylene oxide (PEO), polyether sulfone (PES), phenol formaldehyde (PF), tetrafluoroethylene-perfluoroalkyl vinyl ether copolymer (PFA), polyisobutylene (PIB), and polymethylpentene (PMP).

Other examples of the resin include polyphthalamide (PPA), polyphenylene ether (PPE), polyphenylene oxide (PPO), polytrimethylene terephthalate (PTT), reactive polyurethane (PUR), polyvinyl alcohol (PVA), polyvinyl butyral (PVB), acrylic-modified polyvinyl chloride, polyvinyl dichloride (PVD), and vinyl chloride-vinyl acetate copolymer (PVCA).

Other examples of the resin include polyvinyl formal (PVF), polyvinylpyrrolidone (PVP), styrene butadiene (SB), styrene-butadiene rubber (SBR), styrene block copolymer (SBC), styrene-butadiene-styrene block copolymer (SBS), styrene-ethylene-butylene-styrene block copolymer (SEBS), styrene-ethylene-propylene-styrene block copolymer (SEPS), styrene-isoprene-styrene block copolymer (SIS), sheet molding compound (SMC), syndiotactic polystyrene (SPS), thermoplastic elastomer (TPE), thermoplastic polyurethane (TPU), urea formaldehyde resin (UF), ultra-high molecular weight polyethylene (UHMWPE), vinyl chloride ethylene (VCE), vinyl chloride octyl acrylate (VCOA), and crosslinked polyethylene (XLPE).

6. Method for Producing AlN Whisker Resin Molded Body

6-1. AlN Whisker Production Step

AlN whiskers 300 are produced as descried in the third embodiment.

6-2. AlN Whisker Alignment Step

As described in the present embodiment, AlN whiskers 300 aligned upright are bonded to a tape 2300.

6-3. Resin Molding Step

As described in the present embodiment, the aligned AlN whiskers 300 are solidified with a resin. The tape 2300 is removed from the AlN whiskers 300, to thereby produce a resin molded body.

7. Modifications

7-1. AlN Whiskers

The AlN whiskers 300 used in the fourth embodiment are as described in the third embodiment. However, the AlN whiskers used may be other than those described in the third embodiment.

7-2. Pressure Reduction Step

After introduction of the resin into the gaps between the AlN whiskers 300, pressure may be reduced while the tape 2300 is bonded to the first ends 300a of the AlN whiskers 300. Pressure reduction before solidification of the resin can remove air present between the AlN whiskers 300 and the resin. After hardening of the resin, these members are placed under atmospheric pressure. This step can further improve the adhesion between the AlN whiskers 300 and the resin 410.

7-3. Combination

The aforementioned modifications may be combined in any manner.

Fifth Embodiment

A fifth embodiment will now be described. A resin molded body of the fifth embodiment contains insulating particles and AlN whiskers.

1. Resin Molded Body

Figure 13:
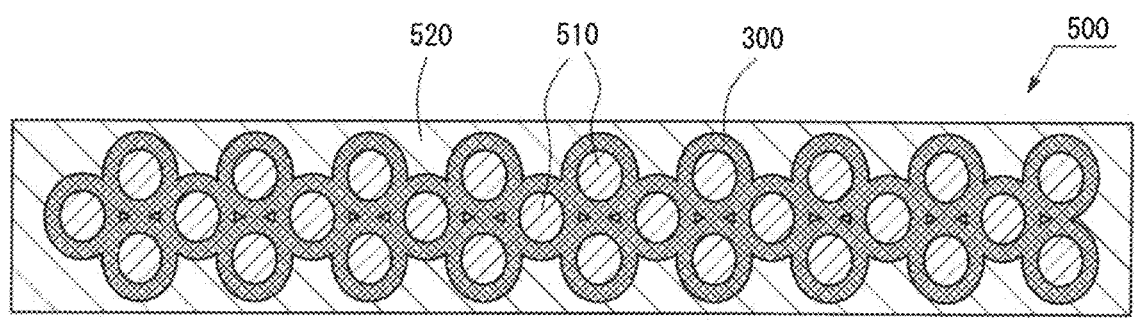
FIG. 13 An illustration of the internal structure of a resin molded body according to a fifth embodiment.

FIG. 13 shows the internal structure of a resin molded body 500 of the present embodiment. The resin molded body 500 contains AlN whiskers 300 of the third embodiment, insulating particles 510, and a resin 520. The insulating particles 510 have high insulation property and high thermal conductivity. Examples of the insulating particles 510 include alumina particles, AlN particles, and silicon nitride particles. Needless to say, the insulating particles 510 may be other particles. However, the insulating particles 510 are preferably formed of a material having high thermal conductivity. A plurality of AlN whiskers 300 cover the insulating particles 510. The resin 520 covers the AlN whiskers 300. A portion of the resin 520 may cover a portion of the surfaces of the insulating particles 510 through gaps between the AlN whiskers 300. The type of the resin 520 may be the same as the resin 410 used in the fourth embodiment.

2. Thermally Conductive Particulate

Figure 14:
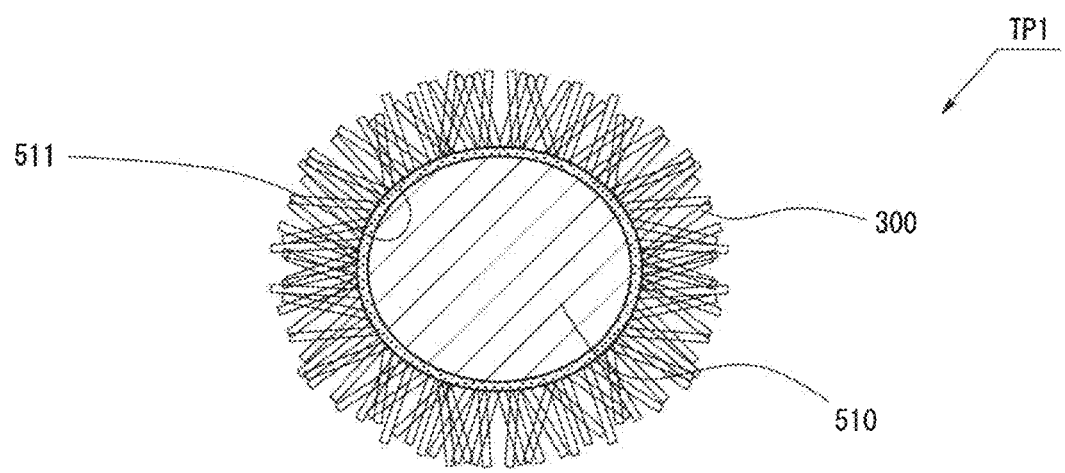
FIG. 14 An illustration of the structure of a thermally conductive particulate forming the resin molded body according to the fifth embodiment.

FIG. 14 shows the structure of a thermally conductive particulate TP1, The thermally conductive particulate TP1 contains an insulating particle 510 and AlN whiskers 300. The thermally conductive particulate TP1 has high thermal conductivity and high insulating property. As shown in FIG. 14, the surface of the insulating particle 510 is covered with numerous AlN whiskers 300 in the thermally conductive particulate TP1. The numerous AlN whiskers 300 are bonded to the insulating particle 510 by means of an adhesive 511.

As shown in FIG. 13, the AlN whiskers 300 of adjacent thermally conductive particulates TP1 are in contact with one another in the resin molded body 500. For example, the AlN whiskers 300 of a first thermally conductive particulate TP1 are in contact with the AlN whiskers 300 of a second thermally conductive particulate TP1.

3. Thermally Conductive Particulate Production Apparatus

Figure 15:
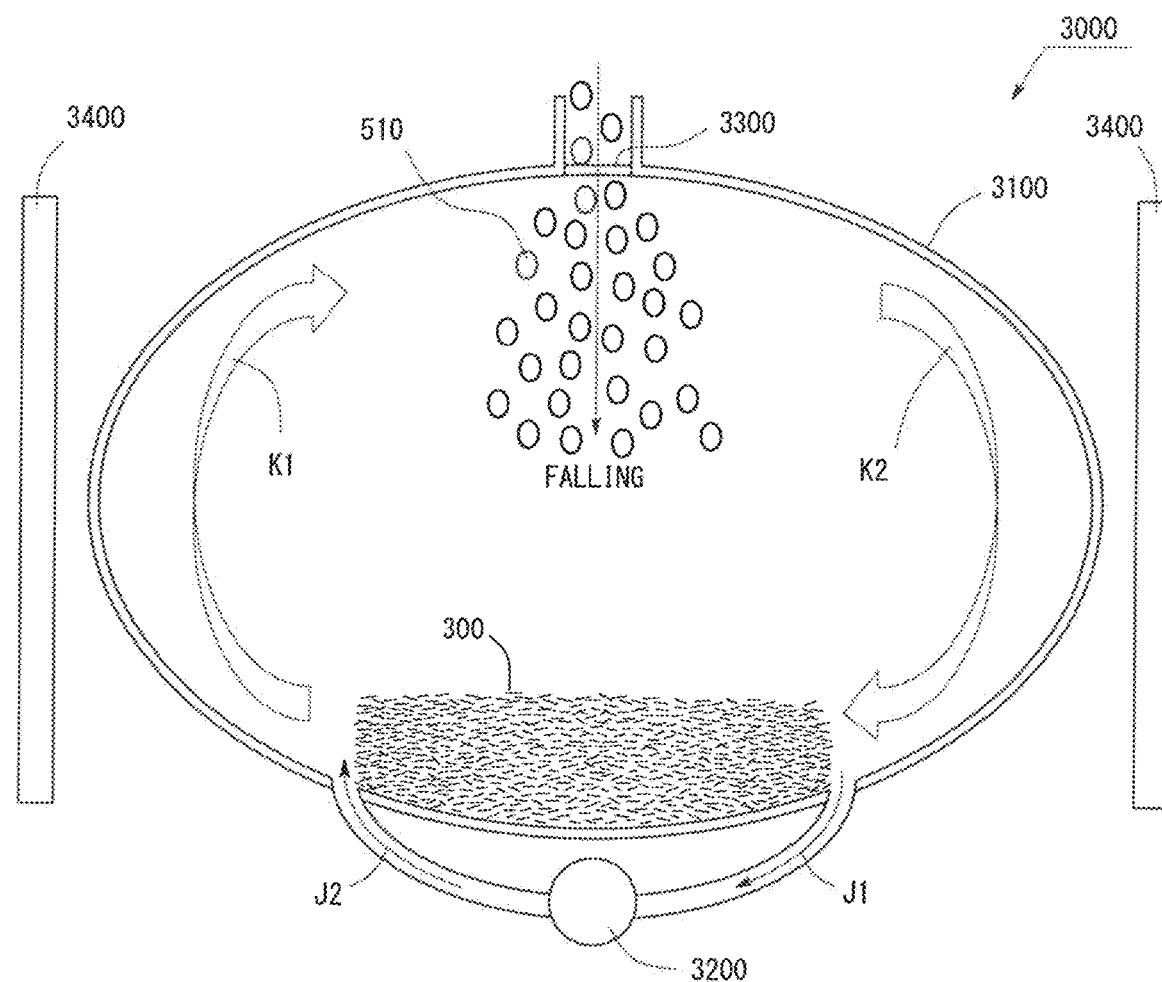
FIG. 15 A schematic illustration of the structure of an apparatus for producing thermally conductive particulates according to the fifth embodiment.

FIG. 15 shows a production apparatus 3000 for producing thermally conductive particulates TP1. The production apparatus 3000 has a container 3100, an air pump 3200, a particle inlet port 3300, and a heater 3400.

The container 3100 accommodates AlN whiskers 300 and also serves as a chamber for performing a process of bonding AlN whiskers 300 to insulating particles 510. The container 3100 has a quasi-spheroidal shape. The container 3100 may have a spherical-like shape. The air pump 3200 is provided tar circulating air in the container 3100 and for causing AlN whiskers 300 to fly in the container 3100.

The particle inlet port 3300 is provided for introducing insulating particles 510 into the container 3100. Thus, the particle inlet port 3300 is configured to be openable and closable. The heater 3400 is provided for heating the interior of the container 3100. Thus, the heater 3400 can heat AlN whiskers 300 and insulating particles 510.

4. Production Method for Thermally Conductive Particulate

Firstly, an adhesive is applied to the surfaces of insulating particles 510. Meanwhile, AlN whiskers 300 are placed in the production apparatus 3000. In this case, the AlN whiskers 300 and the air in the container 3100 may be heated by means of the heater 3400. The air in the container 3100 is then circulated by means of the air pump 3200. The AlN whiskers 300 fly with the circulating airflow. Subsequently, the adhesive-applied insulating particles 510 are supplied through the particle inlet port 3300 into a region where the flying AlN whiskers 300 are present. Thus, the AlN whiskers 300 are bonded to the surfaces of the insulating particles 510 via the adhesive.

5. Production Method for Resin Molded Body

Numerous thermally conductive particulates TP1 are spread over a region where the resin molded body 500 is to be formed. Thus, the thermally conductive particulates TP1 are in contact with one another via the AlN whiskers 300 on the surfaces of the particulates TP1. When the thus-spread thermally conductive particulates TP1 are solidified with a resin, a thermal conduction path is formed via the thermally conductive particulates TP1. Subsequently, a resin is introduced into gaps between the thermally conductive particulates TP1. The resin may be any of those described in the fourth embodiment. The resin is then solidified, to thereby produce the resin molded body 500.

Sixth Embodiment

A sixth embodiment will now be described.

1. $ZrO_2$ Sensor (Sintered Body)

Figure 16:
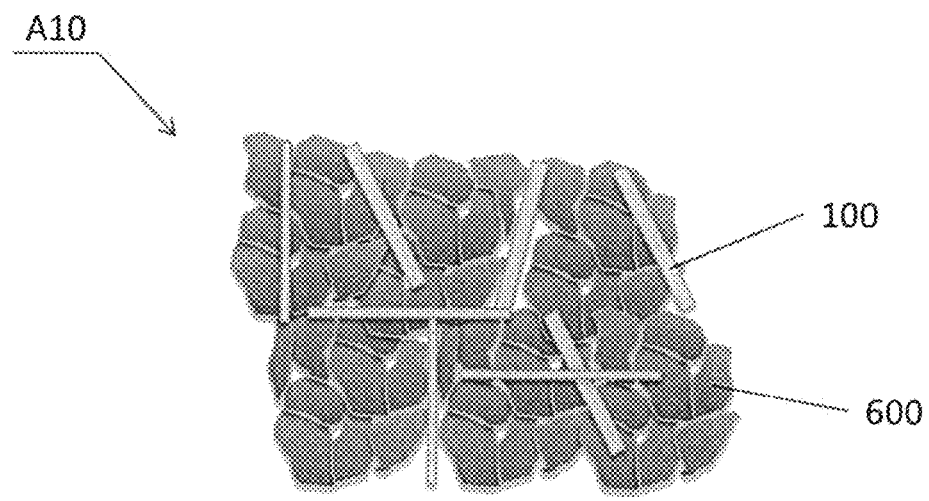
FIG. 16 A schematic illustration of the structure of a $ZrO_2$ sensor according to a sixth embodiment.

FIG. 16 schematically shows the structure of a $ZrO_2$ sensor A10 of the sixth embodiment. As shown in FIG. 16, the $ZrO_2$ sensor A10 is a sintered body containing AlN whiskers 100 and $ZrO_2$ particles 600. The $ZrO_2$ particles 600 are insulating particles covering the AlN whiskers 100. As described below, the $ZrO_2$ sensor A10 contains $Y_2O_3$. Thus, $Y_2O_3$ is present in gaps between the $ZrO_2$ particles 600, gaps between the AlN whiskers 100, and gaps between the $ZrO_2$ particles 600 and the AlN whiskers 100.

The $ZrO_2$ particles 600 have a mean particle size of 1 μm to 100 μm.

2. AlN Whiskers

As shown in FIG. 1, the AlN whiskers 100 of the present embodiment are the same as the AlN whiskers 100 of the first embodiment.

3. Production Method for AlN Whiskers

The production method for the AlN whiskers 100 of the present embodiment is the same as the production method for the AlN whiskers 100 of the first embodiment.

4. Production Method for $ZrO_2$ Sensor (Production Method for Sintered Body)

4-1. AlN Whisker Production Step

AlN whiskers 100 are produced as described above.

4-2. Mixture Preparation Step

A mixture of $ZrO_2$ particles 600 and $Y_2O_3$ particles is prepared. Specifically, $ZrO_2$ particles 600 (95 wt. %, to 98 wt. %) are mixed with $Y_2O_3$ particles (2 wt. % to 5 wt. %) by means of, for example, a ball mill. The $ZrO_2$ particles 600 have a purity of 95% or more. The $ZrO_2$ particles 600 have a mean particle size of 1 μm to 100 μm. The $Y_2O_3$ particles have a purity of 95% or more. The particles have a mean particle size of 1 μm to 100 μm.

4-3. AlN Whisker Mixing Step

AlN whiskers 100 (0.5 wt. % to 40 wt. %) are mixed with a mixture of the $ZrO_2$ particles 600 and the $Y_2O_3$ particles (100 wt. %) by means of a common mixing-stirring tool, such as a mixing-grinding machine or a mortar. Thus, a mixture containing the AlN whiskers 100 is prepared.

4-4. Kneading Step

The mixture containing the AlN whiskers 100 (100 wt. %) is mixed with ethyl alcohol (0.5 wt. % to 50 wt. %). The resultant mixture is formed into a slurry by means of a stirrer. Thus, a slurry mixture is prepared. Water or another alcohol may be used instead of ethyl alcohol.

4-5. Molding Step

Subsequently, the slurry mixture is poured into a mold, to thereby prepare a first molded body.

4-6. Drying Step

The first molded body is then dried. The drying temperature is 60° C. to 350° C. The drying time is one hour to three hours. These numerical ranges are a mere example, and the drying temperature and time may fall within other ranges. Through this step, ethyl alcohol or water is evaporated from the first molded body. The atmosphere temperature of the first molded body may be increased at a rate of 1 to 10° C. per hour. A microwave oven may be used in this step.

4-7. Firing Step

Subsequently, the first molded body is fired by means of an evacuable firing apparatus. The first molded body is placed in the firing apparatus, and then the firing apparatus is evacuated. Thereafter, nitrogen gas is supplied to the firing apparatus; i.e., the apparatus is in a nitrogen atmosphere. The internal atmosphere of the firing apparatus is then heated. For example, the atmosphere temperature is increased from 350° C. to about 1,100° C. for about one hour. The $Y_2O_3$ particles form a liquid phase in association with an increase in the atmosphere temperature. After the atmosphere temperature of the furnace has reached 1,100° C., firing of the first molded body is initiated. The firing temperature is 1,100° C. to 1,600° C. The firing time is 10 minutes to 10 hours. After the elapse of the firing time, the firing apparatus is cooled. For example, the firing apparatus may be cooled at a rate of 100° C. per hour. After the furnace temperature has been sufficiently lowered, the first molded body is removed therefrom.

4-8. Thermal Spraying Step

Subsequently, $\gamma$-$Al_2O_3$ is applied to the surface of the first molded body by means of thermal spraying. The $\gamma$-$Al_2O_3$ specific surface area is 300 m² or more, preferably 1,000 m² or more. This step produces a second molded body including the first molded body and a $\gamma$-$Al_2O_3$ thermal spraying layer formed on the surface of the first molded body.

4-9. Catalyst Metal Deposition Step

Subsequently, the second molded body is immersed in an aqueous solution or organic solution containing a catalyst metal. Examples of the catalyst metal include Pt, Pd, Rd, and Rh. The second molded body is then dried at a temperature of about 300° C. Thus, the $ZrO_2$ sensor A10 is produced.

5. Effects of the Present Embodiment

5-1. Thermal Conductivity

The $ZrO_2$ sensor A10 of the present embodiment contain the AlN whiskers 100 and the $ZrO_2$ particles 600. Since the $ZrO_2$ sensor A10 contains the AlN whiskers 100, it has a thermal conductivity higher than that of any conventional sensor. Thus, the $ZrO_2$ sensor A10 of the present embodiment has high-speed operability. The temperature distribution in the $ZrO_2$ sensor A10 is more uniform. When the $ZrO_2$ sensor A10 is heated, the time required for increasing the internal temperature is shorter as compared with a conventional case. By virtue of these characteristic features, the $ZrO_2$ sensor A10 achieves high-accuracy oxygen measurement.

5-2. Mechanical Strength

The $ZrO_2$ sensor A10 of the present embodiment contains fibrous AlN whiskers 100. The fibrous AlN whiskers 100 contribute to an increase in the mechanical strength of the composite material. Thus, the $ZrO_2$ sensor A10 of the present embodiment has a mechanical strength higher than that of any conventional $ZrO_2$ sensor.

Each AlN whisker 100 has on its surface an oxygen atom-containing layer 120. $Y_2O_3$ forms a liquid phase during sintering. The liquid-phase $Y_2O_3$ is readily bonded to oxygen atoms contained in the oxygen atom-containing layer 120 of the AlN whisker 100 or oxygen atoms contained in the $ZrO_2$ particles 600. Thus, the $ZrO_2$ sensor A10 has high mechanical strength.

5-3. Denseness

The AlN whiskers 100, the $ZrO_2$ particles 600, and $Y_2O_3$ are independent of one another in the $ZrO_2$ sensor A10, and these materials are strongly bonded together. Thus, virtually no gas enters the interfaces between these materials.

6. Modifications

6-1. Insulating Particles

The $ZrO_2$ sensor A10 may contain insulating particles other than the $ZrO_2$ particles 600. That is, the $ZrO_2$ sensor A10 contains one or more types of insulating particles. For example, the $ZrO_2$ sensor A10 may contain. AlN polycrystalline particles. When the $ZrO_2$ sensor A10 contains AlN polycrystalline particles in addition to the AlN whiskers 100, the $ZrO_2$ sensor A10 exhibits improved thermal conductivity.

6-2. Sintering Aid

The $ZrO_2$ sensor A10 may contain an additional sintering aid in the form of insulating particles. For example, the $ZrO_2$ sensor A10 may contain, as sintering aids, CaO and LaB$_6$ in addition to Y$_2$O$_3$. Alternatively, the ZrO$_2$ sensor A10 may contain, as sintering aids, CaO and B$_2$O in addition to Y$_2$O$_3$. A sintered body can be produced even if such a sintering aid is used.

6-3. Atmosphere in Firing Apparatus

The ZrO$_2$ sensor A10 is produced through firing in a nitrogen atmosphere. In some cases, nitrogen gas may be mixed with a small amount of oxygen gas. Thus, the atmosphere in the firing apparatus is a nitrogen-containing atmosphere.

6-4. Al-Containing Material

The Al material used in the present embodiment is industrially refined aluminum. However, an Al alloy may be used instead of such a high-purity Al material. AlN whiskers 100 can be produced even if such an Al atom-containing material is used. However, the use of industrially refined aluminum can reduce incorporation of impurities into the produced AlN whiskers 100.

6-5. Oxygen Atom-Containing Layer

The oxygen atom-containing layer 120 contains at least one of Al$_2$O$_3$, AlON, and Al(OH)$_3$. However, the oxygen atom-containing layer 120 may contain an oxygen atom-containing Al compound other than the aforementioned Al compounds. Thus, the oxygen atom-containing layer 120 is a layer containing an Al atom and an oxygen atom.

6-6. Hot Pressing Step

A hot pressing step may be performed instead of the drying step and firing step in the present embodiment. The hot pressing step is preferably performed in a nitrogen atmosphere.

6-7. Combination

The aforementioned modifications may be combined in any manner.

7. Summary of the Present Embodiment

The ZrO$_2$ sensor A10 of the present embodiment contains the AlN whiskers 100 and the ZrO$_2$ particles 600. Since the ZrO$_2$ sensor A10 contains the AlN whiskers 100, it has a thermal conductivity higher than that of any conventional sensor. Thus, the ZrO$_2$ sensor A10 of the present embodiment has high-speed operability.

Seventh Embodiment

A seventh embodiment will now be described.

1. Catalytic Converter (Sintered Body)

Figure 17:
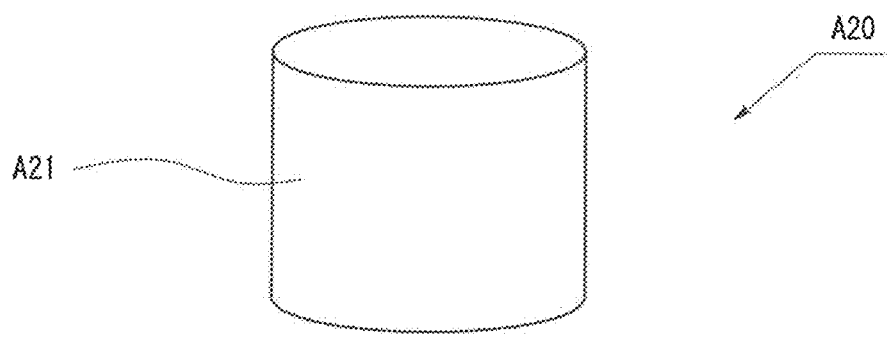
FIG. 17 A perspective view of the external appearance of a catalytic converter according to a seventh embodiment.

FIG. 17 is a perspective view of the external appearance of a catalytic converter A20 of the seventh embodiment. The catalytic converter A20 is an automotive catalytic converter. As described below, the catalytic converter A20 is a sintered body containing AlN whiskers 100 and cordierite 700. The catalytic converter A20 is a device for removing HC, CO, and NOx from engine exhaust gas. The catalytic converter A20 has a surface A21.

Figure 18:
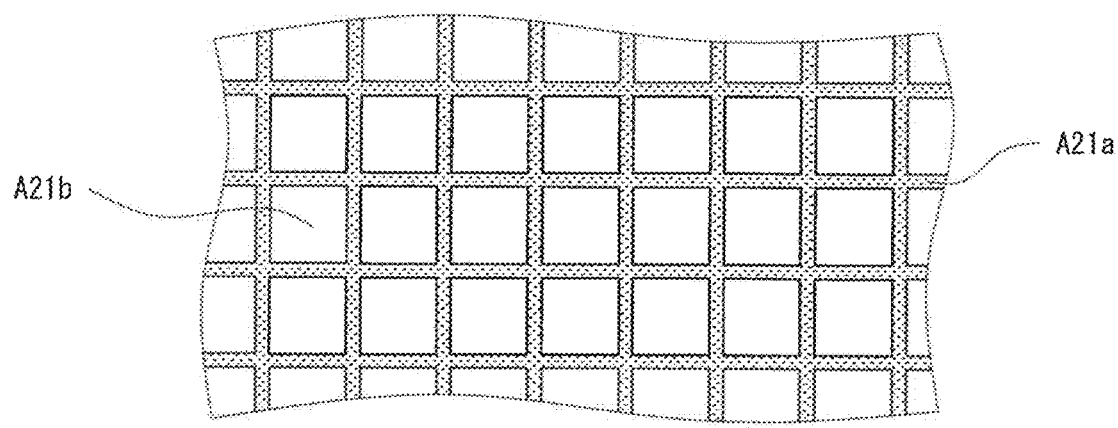
FIG. 18 An enlarged view of the surface of the catalytic converter according to the seventh embodiment.

FIG. 18 is an enlarged view of the surface A21 of the catalytic converter A20. As shown in FIG. 18, the surface A21 of the catalytic converter A20 has numerous through holes A21$b$. The through holes A21$b$ have a quadrangular cross section. The through holes A21$b$ are defined by a wall A21$a$. The through holes A21$b$ may have a hexagonal cross section.

Figure 19:
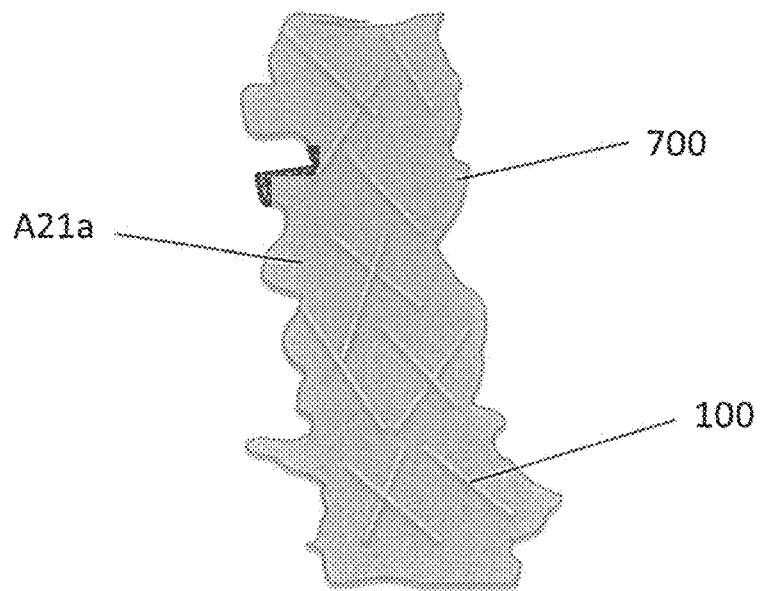
FIG. 19 An enlarged view of the wall of the catalytic converter according to the seventh embodiment.

FIG. 19 is an enlarged view of the wall A21$a$ of the catalytic converter A20. The catalytic converter A20 Contains AlN whiskers 100 and cordierite 700. The AlN whiskers 100 are covered with the cordierite 700. The cordierite 700 has a composition of 2MgO.2Al$_2$O$_3$.5SiO$_2$.

2. Production Method for Catalytic Converter (Production Method for Sintered Body)

2-1. AlN Whisker Production Step

AlN whiskers 100 are produced as described in the first embodiment.

2-2. Mixture Preparation Step

A mixture of raw materials is prepared so as to achieve the composition of the cordierite 700. For example, talc (3MgO.4SiO$_2$.H$_2$O), kaolin (Al$_2$O$_3$.2SiO$_2$.2H$_2$O), and alumina (Al$_2$O$_3$) are provided, and these materials are mixed in proportions so as to achieve the composition of the cordierite 700, to thereby prepare a mixture.

2-3. AlN Whisker Mixing Step

AlN whiskers 100 (0.5 wt. % to 40 wt. %) are mixed with the aforementioned mixture (mixture to achieve the composition of the cordierite 700) (100 wt. %) by means of a common mixing-stirring tool, such as a mixing-grinding machine or a mortar. Thus, a mixture containing the AlN whiskers 100 is prepared.

2-4. Kneading Step

The aforementioned mixture (mixture containing the AlN whiskers 100) (100 wt. %) is mixed with water (0.5 wt. % to 50 wt. %). The resultant mixture is formed into a slurry by means of a stirrer. Thus, a slurry mixture is prepared.

2-5. Molding Step

Subsequently, the slurry mixture is placed in a vacuum extruder. The slurry mixture can be formed into, for example, a honeycomb, quadrangular, or triangular shape by means of this vacuum extruder. A first molded body is prepared through molding by means of the vacuum extruder.

2-6. Drying Step

The first molded body is then dried. The drying temperature is 15° C. to 100° C. The drying time is one hour to three hours. These numerical ranges are a mere example, and the drying temperature and time may fall within other ranges. Through this step, water is evaporated from the first molded body. A microwave oven may be used in this step.

2-7. Firing Step

Subsequently, the first molded body is fired by means of an evacuable firing apparatus. The first molded body is placed in the firing apparatus, and then the firing apparatus is evacuated. Thereafter, nitrogen gas is supplied to the firing apparatus. In some cases, nitrogen gas may be mixed with a small amount of oxygen gas. The internal atmosphere of the firing apparatus is then heated. For example, the atmosphere temperature is increased from 20° C. to about 1,100° C. for about 24 hours. After the atmosphere temperature of the furnace has reached 1,100° C. firing of the first molded body is initiated. The firing temperature is 1,100° C. to 1,500° C. The firing time is 24 hours to 72 hours. After the elapse of the firing time, the firing apparatus is cooled. For example, the firing apparatus may be cooled at a rate of 50° C. to 300° C. per hour. After the furnace temperature has been sufficiently lowered, the first molded body is removed therefrom.

2-8. Immersion Step

Subsequently, the first molded body is immersed in an aqueous $\gamma$-$Al_2O_3$ solution. The $\gamma$-$Al_2O_3$ specific surface area is 300 m$^2$ or more, preferably 1,000 m$^2$ or more. Then, $\gamma$-$Al_2O_3$ is deposited on the surface of the first molded body, and the deposited $\gamma$-$Al_2O_3$ is dried, to thereby prepare a second molded body. Thereafter, the second molded body is dried at a temperature of 500° C. to 700° C.

2-9. Catalyst Metal Deposition Step

Subsequently, the second molded body is immersed in an aqueous solution or organic solution containing a catalyst metal. Examples of the catalyst metal include Pt, Pd, Rd, and Rh. The second molded body is then dried at a temperature of about 300° C. Thus, the catalytic converter A20 is produced.

3. Effects of the Present Embodiment 3-1. Thermal Conductivity

The catalytic converter A20 of the present embodiment contains the AlN whiskers 100 and the cordierite 700. Since the catalytic converter A20 contains the AlN whiskers 100, it has a thermal conductivity higher than that of any conventional catalytic converter. The temperature distribution in the catalytic converter A20 is more uniform.

3-2. Mechanical Strength

The catalytic converter A20 of the present embodiment contains fibrous AlN whiskers 100. Since the fibrous AlN whiskers 100 have toughness, the fibrous AlN whiskers 100 contribute to an increase in the mechanical strength of the composite material. Thus, the catalytic converter A20 of the present embodiment has a mechanical strength higher than that of any conventional catalytic converter.

Therefore, the wall A21a of the catalytic converter A20 can be designed to have a small thickness, and thus exhaust gas pressure loss can be reduced as compared with a conventional case.

4. Design of Catalytic Converter

The catalytic converter containing the AlN whiskers 100 has high mechanical strength. Thus, the catalytic converter of the present embodiment can achieve a mesh of 1,000 cells/inch$^2$ to 3,000 cells/inch$^2$. The thickness of the wall A21a can be adjusted to 100 μm to 200 μm. Any conventional catalytic converter has a mesh of 600 cells/inch$^2$ to 1,000 cells/inch$^2$ and a wall thickness of 200 μm to 500 μm.

5. Summary of the Present Embodiment

The catalytic converter A20 of present embodiment contains the AlN whiskers 100 and the cordierite 700. Since the catalytic converter A20 contains the AlN whiskers 100, it has a thermal conductivity higher than that of any conventional catalytic converter. Furthermore, the catalytic converter A20 has a mechanical strength higher than that of any conventional catalytic converter.

Eighth Embodiment

An eighth embodiment will now be described.

1. Automotive Windowpane (Sintered Body)

Figure 20:
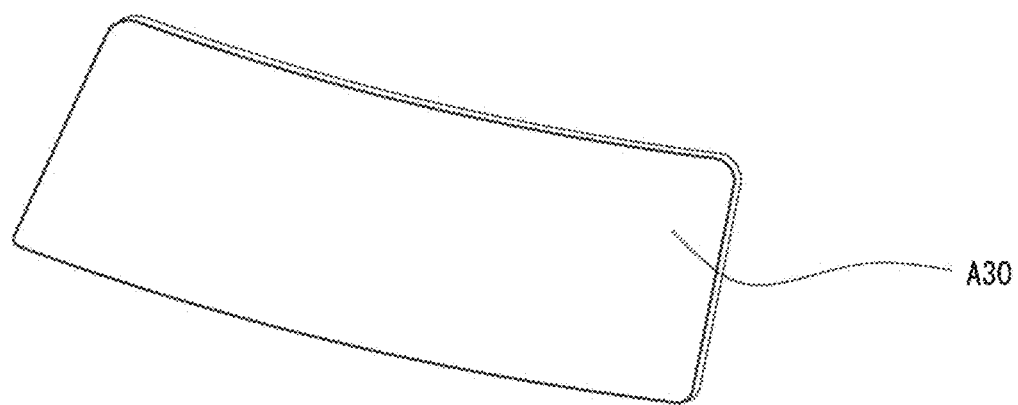
FIG. 20 A perspective view of the external appearance of an automotive windowpane according to an eighth embodiment.

FIG. 20 is a perspective view of the external appearance of an automotive windowpane A30 of the eighth embodiment. As described below, the automotive windowpane A30 is a sintered body containing AlN whiskers 100 and glass.

Figure 21:
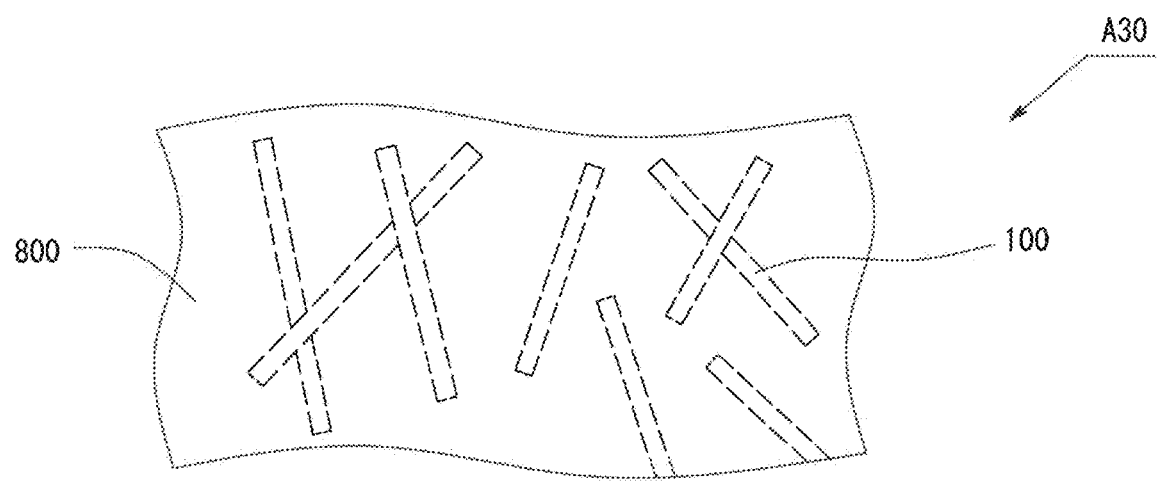
FIG. 21 An illustration of the internal structure of the automotive windowpane according to the eighth embodiment.

FIG. 21 shows the internal structure of the automotive windowpane A30. The automotive windowpane A30 contains AlN whiskers 100 and glass 800. The AlN whiskers 100 are covered with the glass 800.

2. Production Method for Automotive Windowpane (Production Method for Sintered Body)

2-1. AlN Whisker Production Step

AlN whiskers 100 are produced as described in the first embodiment.

2-2. Glass Particle Preparation Step

Firstly, class particles are prepared. For example, silica sand, soda ash, sodium sulfate (mirabilite), feldspar, limestone, and dolomite are fired in an oxygen atmosphere at about 1,600° C. The resultant fired product is pulverized into particles having a size of about 100 μm.

2-3. AlN Whisker Mixing Step

The pulverized particles (95 wt. %) are mixed with the whiskers 100 (5 wt. %), to thereby prepare a mixture containing the AlN whiskers 100. The amount of the AlN whiskers 100 mixed may be a different value.

2-4. Molding Step

Subsequently, the mixture containing the AlN whiskers 100 is subjected to molding, to thereby prepare a first molded body.

2-5. Firing Step

Subsequently, the first molded body is fired by means of an evacuable firing apparatus. The first molded body is placed in the firing apparatus, and then the firing apparatus is evacuated. Thereafter, nitrogen gas is supplied to the firing apparatus. In some cases, nitrogen gas may be mixed with a small amount of oxygen gas. The internal atmosphere of the firing apparatus is then heated. For example, the atmosphere temperature is increased from 15° C. to about 1,100° C. for about 24 hours. After the atmosphere temperature of the furnace has reached 1,000° C., firing of the first molded body is initiated. The firing temperature is 1,000° C. to 1,600° C. The firing time is one hour to 72 hours. After the elapse or the firing time, the firing apparatus is cooled. After the furnace temperature has been sufficiently lowered, the first molded body is removed therefrom. Thus, the automotive windowpane A30 is produced.

3. Effects of the Present Embodiment

3-1. Thermal Conductivity

The automotive windowpane A30 of the present embodiment contains the AlN whiskers 100 and the glass 800. Since the automotive windowpane A30 contains the AlN whiskers 100, it has a thermal conductivity higher than that of any conventional automotive windowpane. The temperature distribution in the automotive windowpane A30 is more uniform.

3-2. Mechanical Strength

The automotive windowpane A30 of the present embodiment contains fibrous AlN whiskers 100. Since the fibrous AlN whiskers 100 have toughness, the fibrous AlN whiskers 100 contribute to an increase in the mechanical strength of the composite material. Thus, the automotive windowpane A30 of the present embodiment has a mechanical strength higher than that of any conventional automotive windowpane.

4. Modifications

4-1. Raw Materials of Glass Particles

The glass particles may be prepared from raw materials other than the aforementioned ones or any of combinations of the raw materials.

5. Summary of the Present Embodiment

The automotive windowpane A30 of the present embodiment contains the AlN whiskers 100 and the glass 800. Since the automotive windowpane A30 contains the AlN whiskers 100, it has a thermal conductivity higher than that of any conventional automotive windowpane. Furthermore, the automotive windowpane A30 has a mechanical strength higher than that of any conventional automotive windowpane.

Combination of Embodiments and Modifications Thereof

The first to eighth embodiments and modifications thereof may be combined in any manner.

EXAMPLES

1. Experiment 1

1-1. Experimental Procedure

A container 1210 accommodating an Al material is placed in a material accommodation unit 1200 of a production apparatus 1000. Subsequently, the interior of a furnace body 1100 is evacuated to about 500 Pa. The interior of the furnace body 1100 is then filled with argon gas. Thereafter, the material accommodation unit 1200 and a reaction chamber 1300 are heated to 1,700° C., and nitrogen gas is introduced into the reaction chamber 1300. The processing time is about two hours.

1-2. Experimental Results

Figure 22:
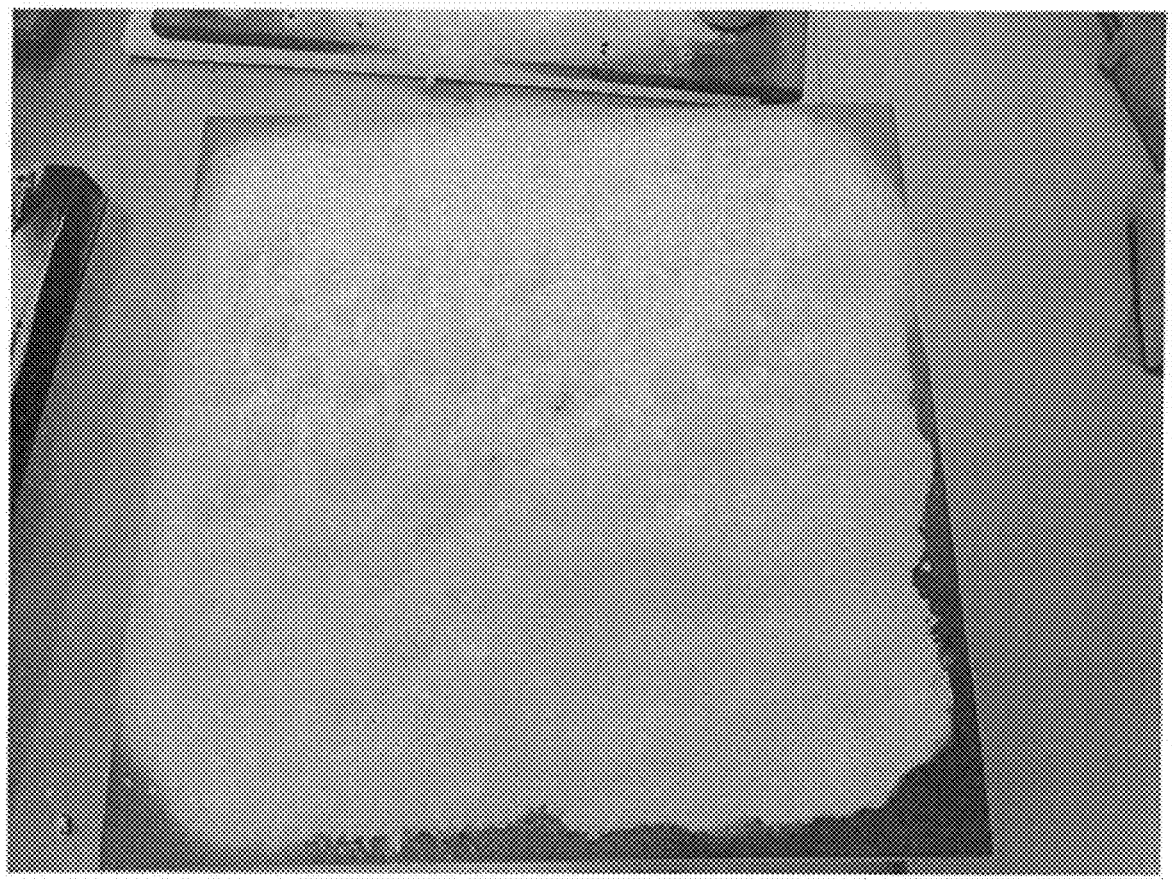
FIG. 22 A photograph of AlN whiskers grown on an alumina substrate.

FIG. 22 is a photograph of AlN whiskers grown on an $Al_2O_3$ substrate. As shown in FIG. 22, a large amount of AlN whiskers are grown on the substrate.

2. Experiment 2

2-1. Experimental Procedure

A container 1210 is placed in a material accommodation unit 1200 of a production apparatus 1000. AlN particles are accommodated in the container 1210. The AlN particles have a size of about 0.2 µm to about 10 mm. Subsequently, the interior of a furnace body 1100 is evacuated to about 500 Pa. The interior of the furnace body 1100 is then filled with argon gas. Thereafter, the material accommodation unit 1200 and a reaction chamber 1300 are heated to 1,700° C., and nitrogen gas is introduced into the reaction chamber 1300. The processing time is about two hours.

2-2. Experimental Results

Figure 23:
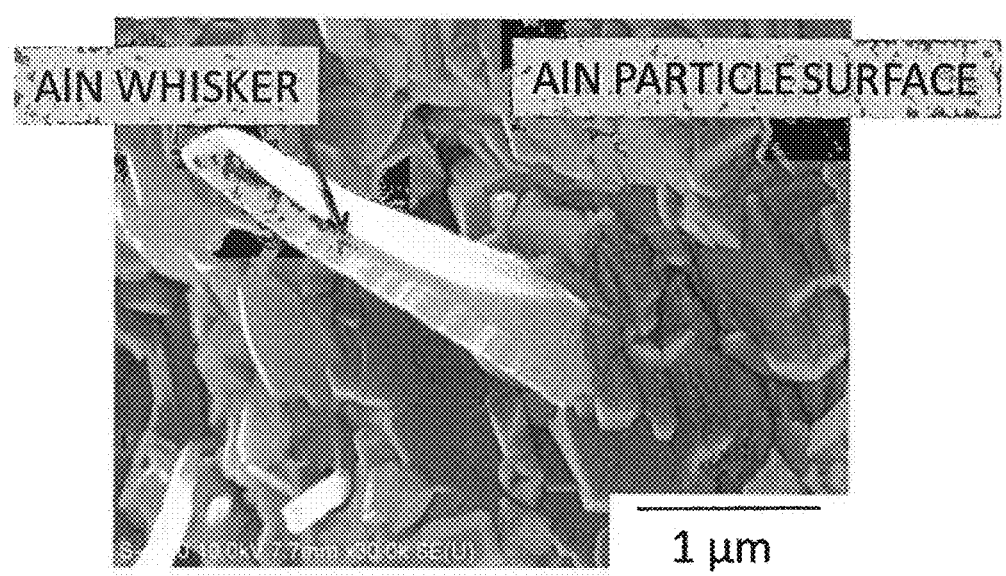
FIG. 23 A scanning micrograph of an AlN whisker (AlN whisker body) grown on AlN particles (part 1).

FIG. 23 is a scanning micrograph of an AlN whisker (AlN whisker body) grown on AlN particles (part 1). As shown in FIG. 23, a fibrous smooth AlN whisker is grown on a portion of the surfaces of AlN particles.

Figure 24:
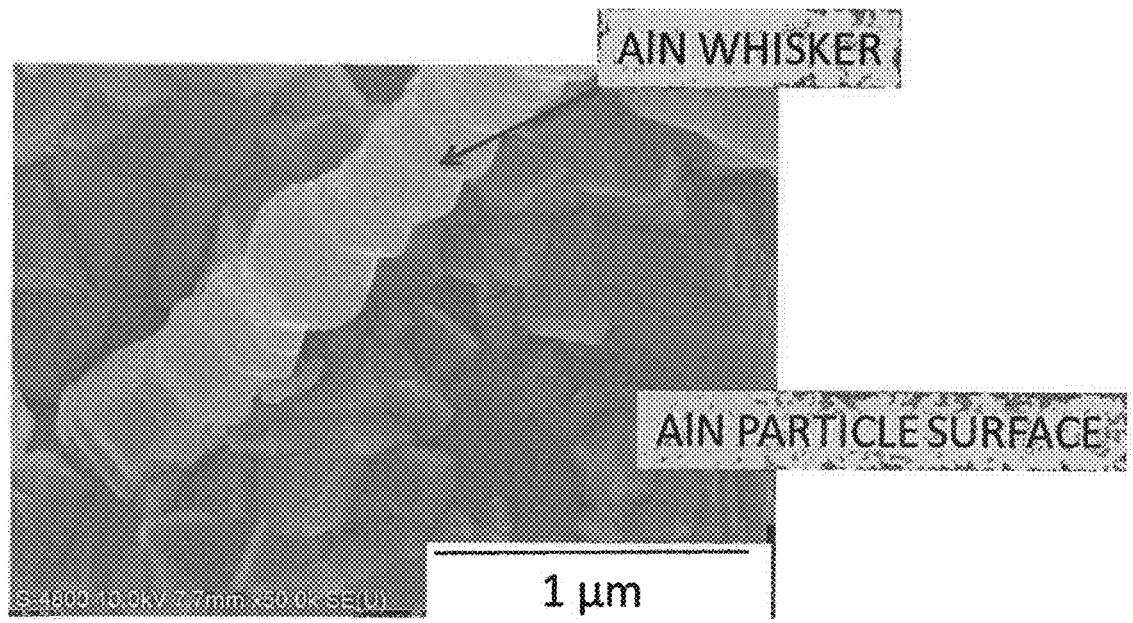
FIG. 24 A scanning micrograph of an AlN whisker (AlN whisker body) grown on AlN particles (part 2).

FIG. 24 is a scanning micrograph of an AlN whisker (AlN whisker body) grown on AlN particles (part 2). As shown in FIG. 24, an AlN whisker having irregularities is grown on a portion of the surfaces of AlN particles. The irregularities correspond to a facet surface.

3. Experiment 3

3-1. Experimental Procedure

A container 1210 is placed in a material accommodation unit 1200 of a production apparatus 1000. Alumina particles are accommodated in the container 1210. The alumina particles have a size of about 0.2 µm to about 10 mm. Subsequently, the interior of a furnace body 1100 is evacuated to about 500 Pa. The interior of the furnace body 1100 is then filled with argon gas. Thereafter, the material accommodation unit 1200 and a reaction chamber 1300 are heated to 1,700° C., and nitrogen gas is introduced into the reaction chamber 1300. The processing time is about two hours.

3-2. Experimental Results

Figure 25:
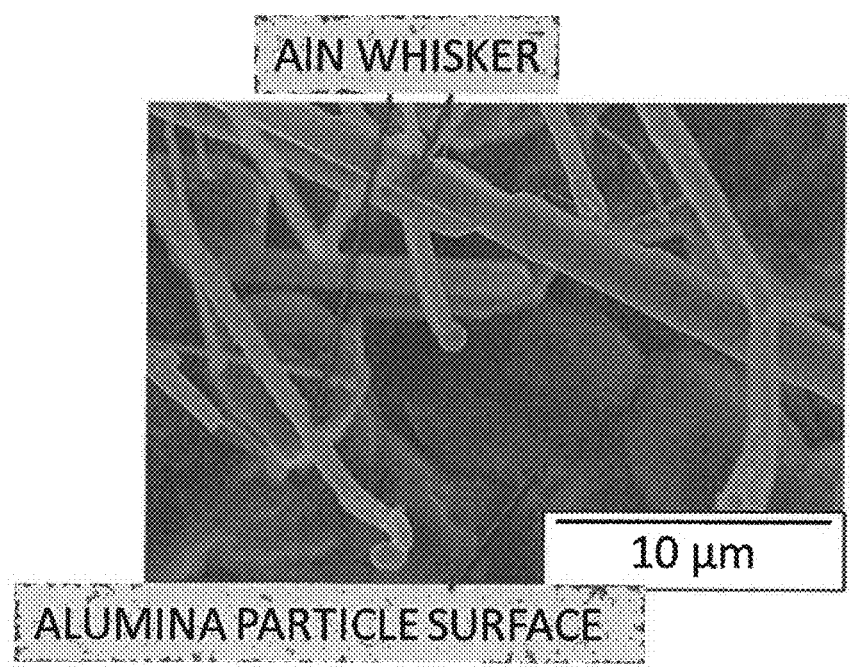
FIG. 25 A scanning micrograph of AlN whiskers (AlN whisker body) grown on alumina particles (part 1).

FIG. 25 is a scanning micrograph of AlN whiskers (AlN whisker body) grown on alumina particles (part 1). As shown in FIG. 25, relatively straight AlN whiskers are grown on the surfaces of alumina particles.

Figure 26:
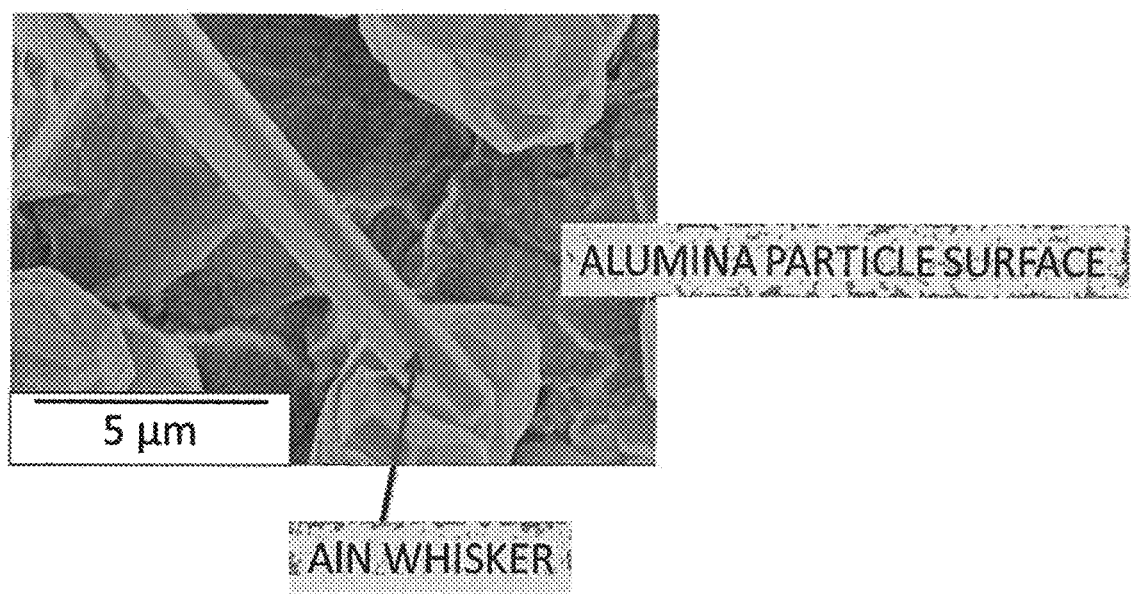
FIG. 26 A scanning micrograph of an AlN whisker (AlN whisker body) grown on alumina particles (part 2).

FIG. 26 is a scanning micrograph of an AlN whisker (AlN whisker body) grown on alumina particles (part 2). As shown in FIG. 26, a very straight AlN whisker is grown on the surfaces of alumina particles.

4. Experiment 4

4-1. Experimental Procedure

Instead of an $Al_2O_3$ substrate 1310, a carbon substrate on which an AlN polycrystalline film has been formed is placed in a production apparatus 1000. AlN whiskers are grown on the AlN polycrystalline film in the same manner as in Experiment 1.

Figure 27:
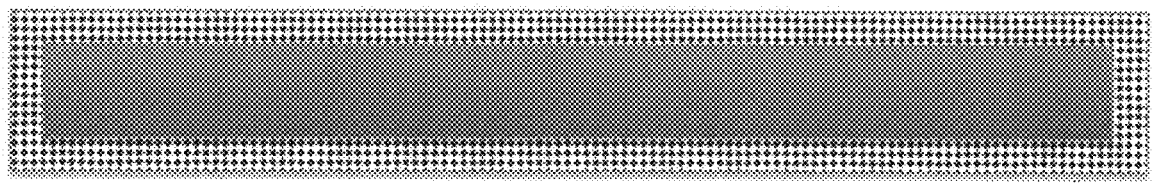
FIG. 27 A cross-sectional view of the structure of a carbon substrate covered with AlN polycrystals.
Figure 28:
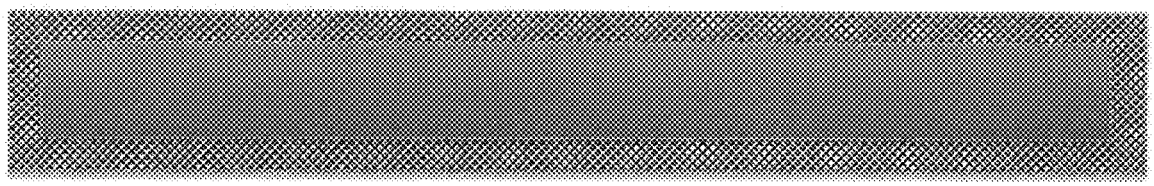
FIG. 28 A cross-sectional view of the structure of a carbon substrate covered with AlN particles.

FIG. 27 is a schematic cross-sectional view of the structure of a carbon substrate covered with AlN polycrystals. FIG. 28 is a schematic cross-sectional view of the structure of a carbon substrate covered with AlN particles.

4-2. Experimental Results

Also in this case, AlN whiskers are formed on the surfaces of the AlN polycrystals.

5. Experiment 5 (Hydrophobization Treatment)

5-1. Experimental Method

Hydrophobization treatment was performed through the following procedure. Fibrous AlN single crystals (0.66 g) having an oxygen atom-containing layer were mixed with stearic acid (4.56 g), to thereby prepare a first mixture (AlN stearic acid=1:1 by mole). The first mixture was mixed with cyclohexane (150 mL) to thereby prepare a second mixture.

Subsequently, the second mixture was refluxed. The temperature of water was adjusted to 88.5° C. The reflux was performed for three hours. After the elapse of three hours, the mixture was cooled to 40° C. and then subjected to filtration, to thereby separate AlN whiskers from the second mixture. The AlN whiskers were washed with cyclohexane. Thereafter, the AlN whiskers were dried under reduced pressure for five minutes. Thus, the AlN whiskers 300 of the third embodiment were produced.

5-2. Experimental Results

5-2-1. Before Hydrophobization Treatment

Figure 29:
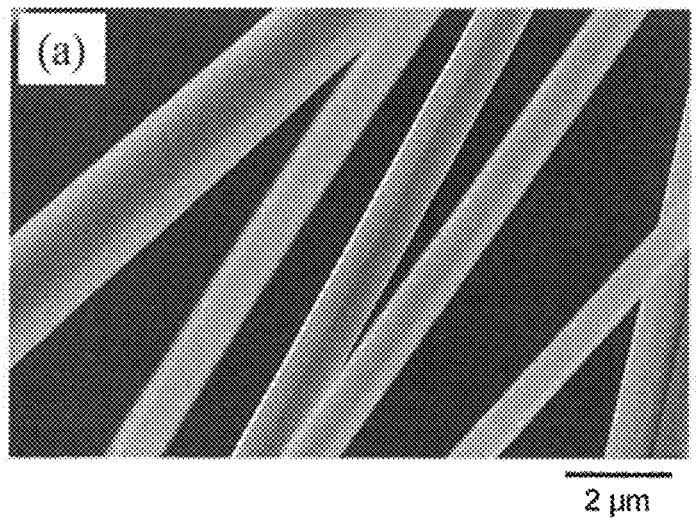
FIG. 29 A scanning micrograph of AlN whiskers before hydrophobization treatment.

FIG. 29 is a scanning micrograph of the AlN whiskers before the hydrophobization treatment. As shown in FIG. 29, the AlN whiskers have a smooth surface.

Figure 30:
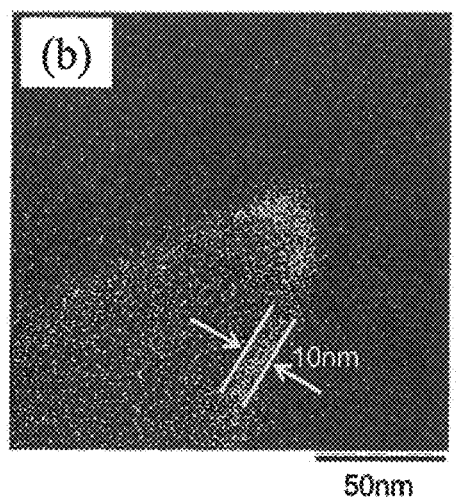
FIG. 30 An oxygen mapping image of an AlN whisker before hydrophobization treatment as obtained by electron energy loss spectroscopy (part 1).
Figure 31:
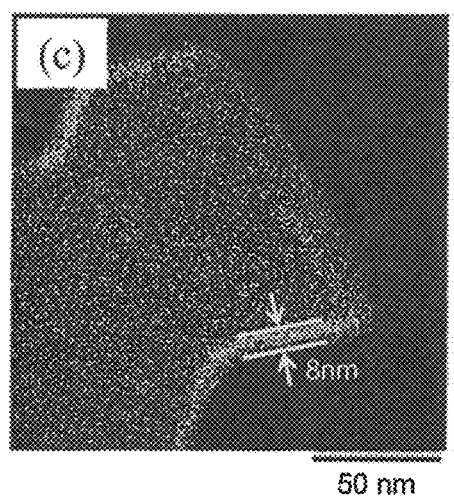
FIG. 31 An oxygen mapping image of an AlN whisker before hydrophobization treatment as obtained by electron energy loss spectroscopy (part 2).

FIGS. 30 and 31 are oxygen mapping images of the AlN whiskers before the hydrophobization treatment as obtained by electron energy loss spectroscopy. FIG. 30 shows an oxygen atom-containing layer having a thickness of 10 nm. FIG. 31 shows an oxygen atom-containing layer having a thickness of 8 nm. Although these oxygen mapping images indicate that the oxygen atom-containing layer contains oxygen atoms, the composition of the oxygen atom-containing layer is difficult to specify.

5-2-2. Comparison Between Before and After Hydrophobization Treatment

Figure 32:
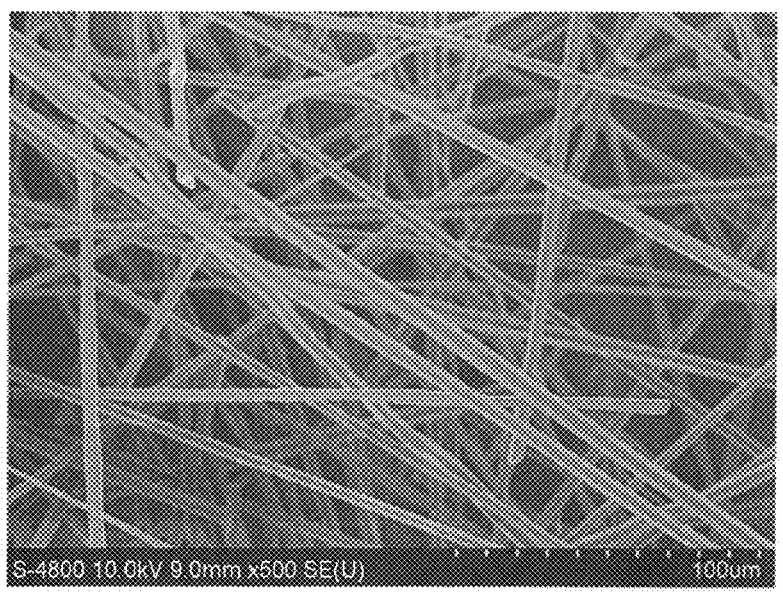
FIG. 32 A scanning micrograph of AlN whiskers before hydrophobization treatment.
Figure 33:
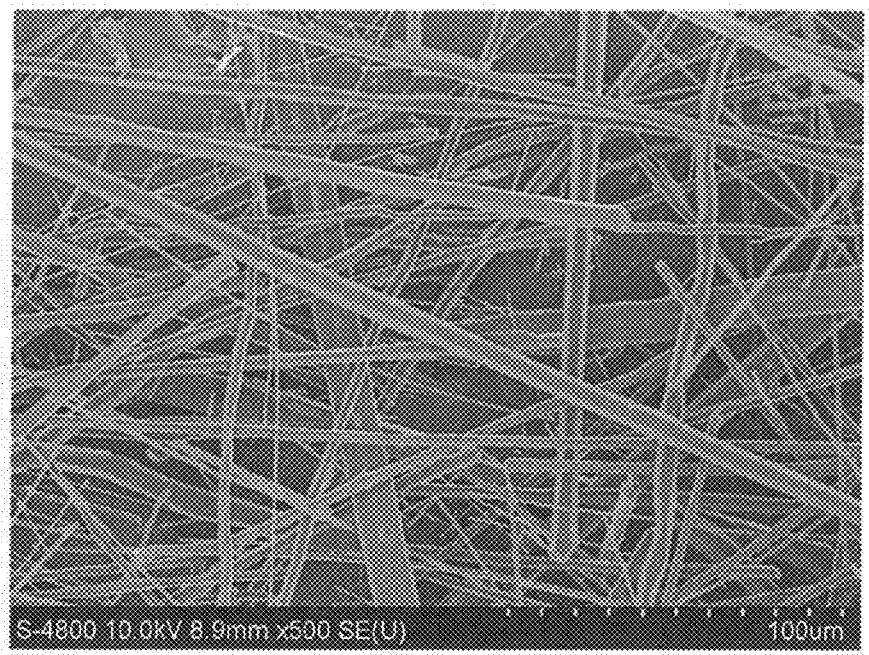
FIG. 33 A scanning micrograph of AlN whiskers after hydrophobization treatment.

FIG. 32 is a scanning micrograph of the AlN whiskers before the hydrophobization treatment. FIG. 33 is a scanning micrograph of the AlN whiskers after the hydrophobization treatment. These micrographs indicate that a thin layer was formed through the hydrophobization treatment. This thin layer corresponds to a hydrophobic layer 330. Since the hydrophobic layer 330 has a very small thickness, the AlN whiskers undergo almost no change in basic shape through the hydrophobization treatment. The AlN whiskers did not have staining caused by stearic acid. The presence of the hydrophobic layer 330 improves the adhesion between a resin material and the AlN whiskers 300.

6. Experiment 6 (Resin Molded Body Containing Aligned AlN Whiskers)

6-1. Experimental Method

AlN whiskers having a diameter of 1 μm to 3 μm and a length of 200 μm to 500 μm were produced by the method of Experiment 1. The AlN whiskers were aligned by means of the alignment apparatus 2000. While the first ends of the AlN whiskers were bonded to a tape, an epoxy resin was added to the AlN whiskers. The mixing ratio of the AlN whiskers to the epoxy resin was 1 wt. %. While the AlN whiskers were aligned, the epoxy resin was solidified under reduced pressure. This process produced a resin molded body containing the AlN whiskers extending between the first surface and the second surface.

6-2. Experimental Results

The resin molded body was found to have a thermal conductivity of 3 W/mk to 5 W/mk between the first and second surfaces. The epoxy resin itself was found to have a thermal conductivity of about 0.2 W/mk. An increase in the amount of AlN whiskers to be added caused an increase in the thermal conductivity of the resin molded body. Thus, the method can produce resin molded bodies having different thermal conductivities. AlN whiskers (diameter: about 50 μm, length: about 10 mm) that had not been subjected to hydrophobization treatment were found to have a thermal conductivity of about 250 W/mk.

7. Experiment 7 (AlN Whiskers)

7-1. Shape of AlN Whiskers

Figure 34:
FIG. 34 A scanning micrograph of the external appearance of AlN whiskers.
Figure 35:
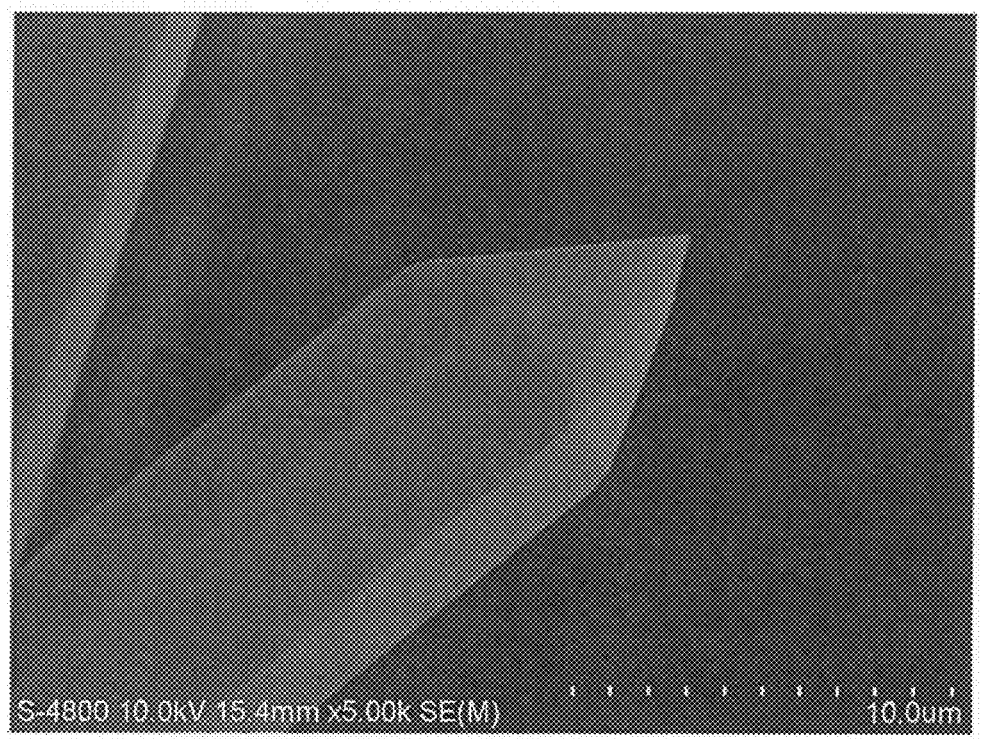
FIG. 35 An enlarged scanning micrograph of an AlN whisker.

FIG. 34 is a scanning micrograph of the external appearance of AlN whiskers 100. FIG. 35 is an enlarged scanning micrograph of an AlN whisker 100. As shown in FIG. 35, a hexagonal single crystal is grown.

7-2. AlN Single Crystal

Figure 36:
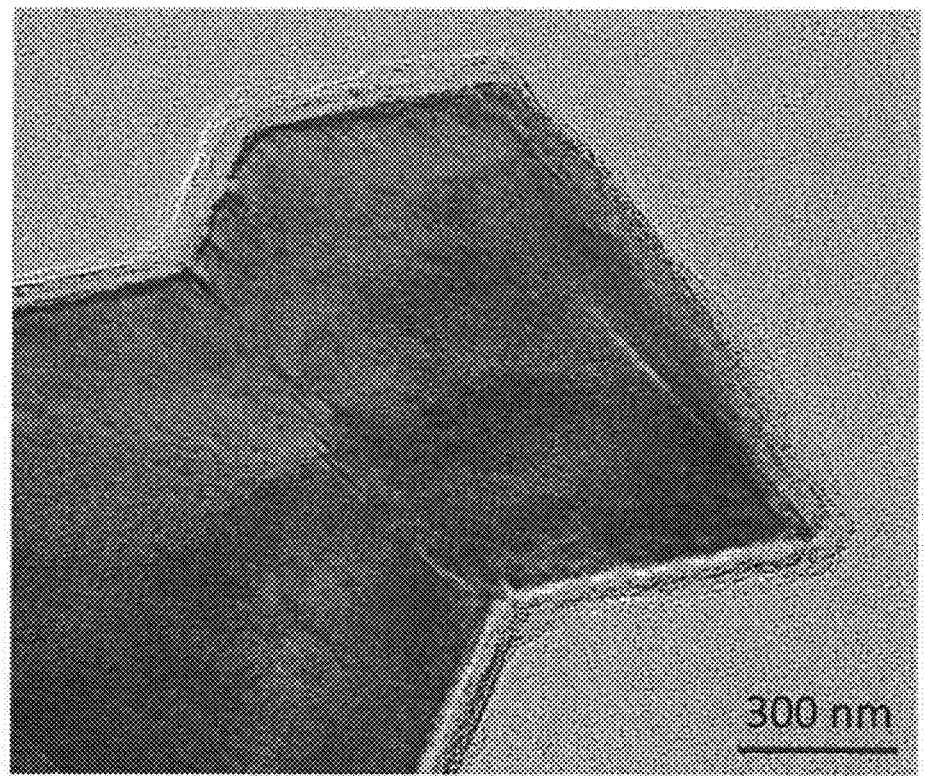
FIG. 36 A transmission micrograph of an AlN whisker.

FIG. 36 is a transmission micrograph of an AlN whisker 100, As shown in FIG. 36, the AlN single crystal 110 is certainly in the form of single crystal.

7-3. Oxygen Atom-Containing Layer

Figure 37:
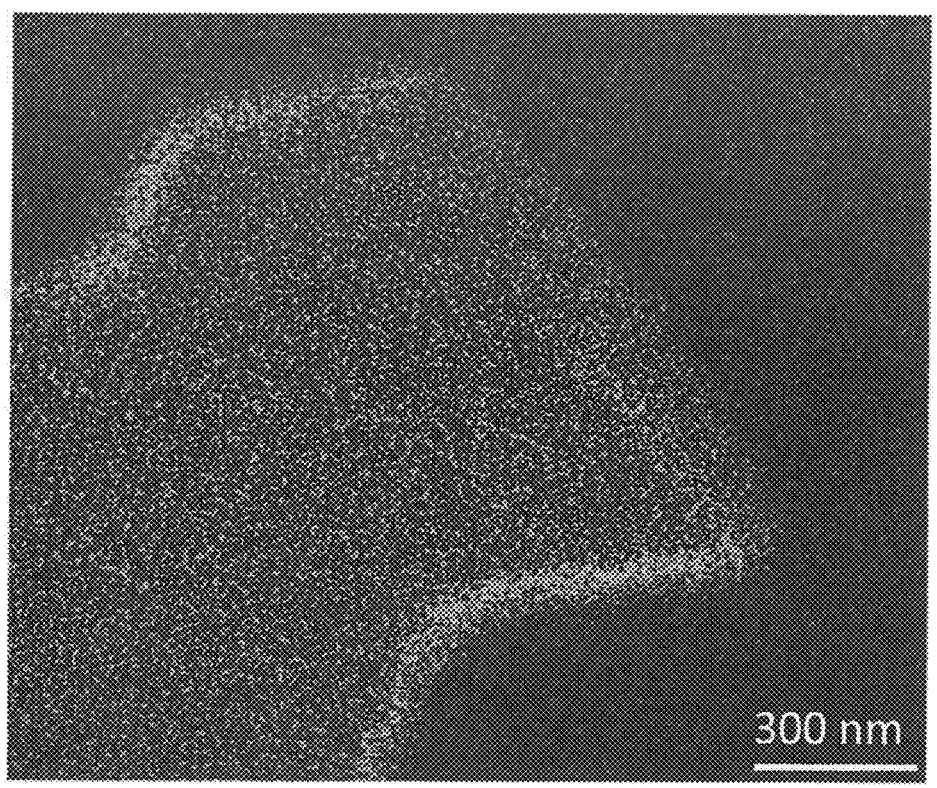
FIG. 37 An image of oxygen atom mapping in an AlN whisker.

FIG. 37 is an oxygen mapping image of an AlN whisker 100. In FIG. 37, white dots correspond to oxygen atoms. As shown in FIG. 37, an oxygen atom-containing layer having a thickness of 7 nm to 10 nm is present on the surface of the AlN single crystal 110.

8. Experiment 8 ($ZrO_2$ Sensor)

8-1. Sample

There were prepared a $ZrO_2$ sensor containing AlN whiskers 100 (sample A1: sensor of the sixth embodiment) and a $ZrO_2$ sensor containing no AlN whiskers 100 (sample A2: conventional sensor). Sample A1 was found to contain the AlN whiskers 100 in an amount of 1 wt. %.

8-2. Underwater Test

The two samples were heated and then placed in water. Thereafter, the presence or absence of cracks was determined. Cracks were generated in sample A1 when the sample was heated to about 450° C. to about 500° C. Meanwhile, cracks were generated in sample A2 when the sample was heated to 400° C. Thus, sample A1 (i.e., sample of the sixth embodiment) has thermal resistance higher than that of sample A2 (i.e., conventional sample).

8-3. Heating Time

The two samples were heated to 600° C., and the time elapsed until the interior of each sample reached 600° C. was measured. The elapsed time was about 10 minutes in sample A1. The elapsed time was 20 minutes in sample A2. Thus, sample A1 (i.e., sample of the sixth embodiment) has a thermal conductivity sufficiently higher than that of sample A2 (i.e., conventional sample).

8-4. Air-Fuel Ratio

The two samples were used to determine the air-fuel ratio of an automotive engine. The air-fuel ratio in the case of sample A1 was comparable to that in the case of sample A2.

9. Experiment 9 (Catalytic Converter)

9-1. Sample

There were prepared a catalytic converter containing AlN whiskers 100 (sample B1: catalytic converter of the seventh embodiment) and a catalytic converter containing no AlN whiskers 100 (sample B2: conventional catalytic converter). Sample B1 was found to contain the AlN whiskers 100 in an amount of 5 wt. %.

9-2. Underwater Test

The two samples were heated and then placed in water. Thereafter, the presence or absence of cracks was determined, Cracks were generated in sample B1 when the sample was heated to about 700° C. Meanwhile, cracks were generated in sample B2 when the sample was heated to 600° C. Thus, sample B1 (i.e., sample of the seventh embodiment) has thermal resistance higher than that of sample B2 (i.e., conventional sample). Sample B1 (i.e., sample of the seventh embodiment) has mechanical strength higher than that of sample B2 (i.e., conventional sample).

9-3. Heating Time

The two samples were heated to 600° C., and the time elapsed until the interior of each sample reached 600° C. was measured. The elapsed time was about 10 minutes in sample B1. The elapsed time was 20 minutes in sample B2. Thus, sample B1 (i.e., sample of the seventh embodiment) has a thermal conductivity sufficiently higher than that of sample B2 (i.e., conventional sample).

10. Brief Summary

AlN whiskers were able to be grown on various insulating substrates, AlN whiskers are probably grown on a specific plane (e.g., (0001) plane) of AlN particles or alumina particles. Thus, the crystal planes of AlN particles or alumina particles correspond approximately to the crystal planes of AlN whiskers. Conceivably, virtually no lattice defects are present between AlN particles or alumina particles and AlN whiskers. Therefore, the resultant AlN whisker body has high thermal conductivity.

A. Additional Remarks

According to a first aspect, there is provided a method for producing AlN whiskers, the method comprising heating an Al-containing material in a first chamber to thereby generate Al gas; and introducing the Al gas into a second chamber through a first inlet port while introducing nitrogen gas into the second chamber through a second inlet port, to thereby grow AlN whiskers on the surface of an insulating substrate placed in the second chamber.

In the method for producing AlN whiskers, the first chamber for generating Al gas is provided separately from the second chamber for growing AlN whiskers, and AlN whiskers are grown on the insulating substrate in the second chamber. Thus, incorporation of other metal particles into the grown AlN whiskers is prevented during recovery of the AlN whiskers.

In the method for producing AlN whiskers according to a second aspect, the insulating substrate is any of an $Al_2O_3$ substrate, an AlN polycrystalline substrate, $Al_2O_3$ particles, and AlN particles. AlN whiskers are readily grown on the surface of such an insulating substrate.

In the method for producing AlN whiskers according to a third aspect, the atmosphere temperature in the second chamber is adjusted to 1,500° C. to 1,800° C. during growth of AlN whiskers. AlN whiskers are effectively grown at such an atmosphere temperature.

According to a fourth aspect, there is provided an apparatus for producing AlN whiskers, the apparatus comprising a material accommodation unit for accommodating an Al-containing material; a reaction chamber for growing AlN whiskers; and a first heating unit for heating at least the material accommodation unit. The reaction chamber includes one or more species of insulating substrates. The first heating unit heats the Al-containing material accommodated in the material accommodation unit. The production apparatus has one or more communication portions that communicate between the material accommodation unit and the reaction chamber.

In the apparatus for producing AlN whiskers, the material accommodation unit for generating Al gas is provided separately from the reaction chamber for growing AlN whiskers, and AlN whiskers are grown on the insulating substrate(s) in the reaction chamber. Thus, incorporation of other metal particles into the grown AlN whiskers is prevented during recovery of the AlN whiskers.

In the apparatus for producing AlN whiskers according to a fifth aspect, the first heating unit heats the reaction chamber. Thus, the atmosphere temperature of the reaction chamber can be maintained at a temperature suitable for growth of AlN whiskers.

The apparatus for producing AlN whiskers according to a sixth aspect comprises a second heating unit for heating the reaction chamber. Thus, the atmosphere temperatures of the material accommodation unit and the reaction chamber can be adjusted to different temperatures.

The apparatus for producing AlN whiskers according to a seventh aspect comprises an openable and closable unit for switching the open state and the closed state of an opening(s)

of the one or more communication portions. The openable and closable unit can control the timing of introduction of Al gas into the reaction chamber, and can also prevent flow of nitrogen gas from the reaction chamber into the material accommodation unit.

In the apparatus for producing AlN whiskers according to an eighth aspect, the material accommodation unit is disposed vertically below the reaction chamber. Thus, Al gas generated in the material accommodation unit readily flows into the reaction chamber.

According to a ninth aspect, there is provided an AlN whisker body comprising an AlN particle or an $Al_2O_3$ particle, and an AlN whisker bonded to the surface of the AlN particle or the $Al_2O_3$ particle. This AlN whisker body is a novel material.

According to a tenth aspect, there is provided an AlN whisker body comprising, a carbon substrate, an AlN polycrystal or AlN particle formed on the surface of the carbon substrate, and an AlN whisker bonded to the surface of the AlN polycrystal or the AlN particle.

According to an eleventh aspect, there is provided an AlN whisker comprising a fibrous AlN single crystal, an oxygen atom-containing layer covering the AlN single crystal, and a hydrophobic layer covering the oxygen atom-containing layer. The oxygen atom-containing layer is formed through incorporation of at least oxygen atoms into the AlN single crystal. The hydrophobic layer has a hydrocarbon group.

The AlN whisker has high adhesion to a resin material, since the hydrophobic layer, which is formed through hydrophobization treatment, is readily bonded to the resin material. Thus, when the AlN whisker is mixed with a resin material to thereby produce a composite material, gaps are less likely to be generated between the AlN whisker and the resin material; i.e., the composite material has high thermal conductivity. The oxygen atom-containing layer is formed through incorporation of at least oxygen atoms into the AlN single crystal. Thus, the crystallinity of the oxygen atom-containing layer is somewhat derived from the crystallinity of the AlN single crystal; i.e., the oxygen atom-containing layer has a dense crystalline structure. Therefore, oxygen atoms are less likely to reach deep into the oxygen atom-containing layer. Consequently, the oxygen atom-containing layer has a thickness sufficiently smaller than that of an oxygen atom-containing layer formed through oxidation treatment of AlN. The oxygen atom-containing layer formed through oxidation treatment of AlN has a thickness of 1 µm or more.

In the AlN whisker according to a twelfth aspect, the oxygen atom-containing layer is bonded to the hydrophobic layer by means of an ester bond.

In the AlN whisker according to a thirteenth aspect, the oxygen atom-containing layer contains at least one of $Al_2O_3$, AlON, and $Al(OH)_3$.

In the AlN whisker according to a fourteenth aspect, the oxygen atom-containing layer has a thickness of 7 nm to 500 nm.

According to a fifteenth aspect, there is provided a method for producing AlN whiskers, the method comprising heating an Al-containing material in a first chamber to thereby generate Al gas; introducing the Al gas into a second chamber through a first inlet port while introducing nitrogen gas into the second chamber through a second inlet port; growing a fibrous AlN single crystal on the surface of an insulating substrate placed in the second chamber; forming an oxygen atom-containing layer on the surface or the AlN single crystal; and forming a hydrocarbon group on the surface of the oxygen atom-containing layer.

In the method for producing AlN whiskers according to a sixteenth aspect, the hydrocarbon group is formed by mixing the AlN single crystal having the oxygen atom-containing layer with stearic acid and cyclohexane, and refluxing the resultant mixture.

According to a seventeenth aspect, there is provided a resin molded body comprising an AlN whisker having a first end and a second end, and a resin material covering the AlN whisker. The resin molded body has a first surface and a second surface opposite the first surface. The first end of the AlN whisker is exposed at the first surface, and the second end of the AlN whisker is exposed at the second surface.

In the resin molded body according to an eighteenth aspect, the angle between the axial direction of the AlN whisker and the first surface is 60° to 120°.

In the resin molded body according to a nineteenth aspect, the AlN whisker comprises a fibrous AlN single crystal, an oxygen atom-containing layer covering the AlN single crystal, and a hydrophobic layer covering the oxygen atom-containing layer. The oxygen atom-containing layer is formed through incorporation of at least oxygen atoms into the AlN single crystal. The hydrophobic layer has a hydrocarbon group.

According to a twentieth aspect, there is provided a resin molded body comprising an insulating particle, a plurality of AlN whiskers covering the insulating particle, and a resin covering the AlN whiskers.

In the resin molded body according to a twenty-first aspect, the AlN whisker comprises a fibrous AlN single crystal, an oxygen atom-containing layer covering the AlN single crystal, and a hydrophobic layer covering the oxygen atom-containing layer. The oxygen atom-containing layer is formed through incorporation of at least oxygen atoms into the AlN single crystal. The hydrophobic layer has a hydrocarbon group.

According to a twenty-second aspect, there is provided a method for producing a resin molded body, the method comprising applying an electric field to an AlN whisker having a first end to thereby bond the first end of the AlN whisker to an adhesive member; impregnating the AlN whisker, whose first end is bonded to the adhesive member, with a liquid resin; and solidifying the resin to thereby remove the adhesive member from the first end of the AlN whisker.

According to a twenty-third aspect, there is provided a method for producing a resin molded body, the method comprising applying an adhesive to the surfaces of insulating particles; causing AlN whiskers to fly by means of airflow; adding the adhesive-applied insulating particles to a region where the AlN whiskers fly, to thereby produce thermally conductive particulates; and introducing a resin into gaps between the thermally conductive particulates.

According to a twenty-fourth aspect, there is provided sintered body comprising an AlN whisker including a fibrous AlN single crystal and an oxygen atom-containing layer covering the AlN single crystal, and one or more species of insulating particles covering the AlN whisker. The oxygen atom-containing layer is formed through incorporation of at least oxygen atoms into the AlN single crystal.

Since the sintered body contains the AlN whisker, it has a thermal conductivity higher than that of any conventional sintered body. Thus, the temperature distribution in the sintered body is almost uniform. Since the AlN whisker has high toughness, the sintered body has a mechanical strength higher than that of any conventional sintered body. The oxygen atom-containing layer is formed through incorporation of at least oxygen atoms into the AlN single crystal.

Thus, the crystallinity of the oxygen atom-containing layer is somewhat derived from the crystallinity of the AlN single crystal; i.e., the oxygen atom-containing layer has a dense crystalline structure. Therefore, oxygen atoms are less likely to reach deep into the oxygen atom-containing layer. Consequently, the oxygen atom-containing layer has a thickness sufficiently smaller than that of an oxygen atom-containing layer formed through oxidation treatment of AlN. The oxygen atom-containing layer formed through oxidation treatment of AlN has a thickness of 1 μm or more.

In the sintered body according to a twenty-fifth aspect, the oxygen atom-containing layer has a thickness of 7 nm to 500 nm.

In the sintered body according to a twenty-sixth aspect, the oxygen atom-containing layer contains at least one of $Al_2O_3$, AlON, and $Al(OH)_3$.

In the sintered body according to a twenty-seventh aspect, the one or more species of insulating particles contain AlN polycrystalline particles.

According to a twenty-eighth aspect, the sintered body is a $ZrO_2$ sensor, and the one or more species insulating particles contain $ZrO_2$.

According to a twenty-ninth aspect, the sintered body is a catalytic converter, and the one or more species of insulating particles contain cordierite.

According to a thirtieth aspect, the sintered body is an automotive windowpane, and the one or more species of insulating particles contain glass.

According to a thirty-first aspect, there is provided a method for producing a sintered body, the method comprising heating an Al-containing material in a first chamber to thereby generate Al gas; introducing the Al gas into a second chamber through a first inlet port while introducing nitrogen gas into the second chamber through a second inlet port; growing a fibrous AlN single crystal on the surface of an insulating substrate placed in the second chamber; forming an oxygen atom-containing layer on the surface of the AlN single crystal; mixing the AlN single crystal with one or more species of insulating particles to thereby prepare a mixture; and firing the mixture to thereby produce a sintered body.

In the method for producing a sintered body according to a thirty-second aspect, the mixture is fired in a nitrogen-containing atmosphere.

In the method for producing a sintered body according to a thirty-third aspect, the sintered body is a $ZrO_2$ sensor, and the one or more species of insulating particles contain $ZrO_2$.

In the method for producing a sintered body according to a thirty-fourth aspect, the sintered body is a catalytic converter, and the one or more species of insulating particles contain cordierite.

In the method for producing a sintered body according to a thirty-fifth aspect, the sintered body is an automotive windowpane, and the one or more species of insulating particles contain glass.

DESCRIPTION OF REFERENCE NUMERALS

100: AlN whisker
110: AlN single crystal
120: Oxygen atom-containing layer
200: AlN whisker body
210: AlN particle
211: Surface
300: AlN whisker
300a: First end
300b: Second end
310: AlN single crystal
320: Oxygen atom-containing layer
330: Hydrophobic layer
400: Resin molded body
400a: First surface
400b: Second surface
410: Resin
500: Resin molded body
600: $ZrO_2$ particle
700: Cordierite
800: Glass
1000: Production apparatus
1100: Furnace body
1200: Material accommodation unit
1210: Container
1220: Communication portion
1220a, 1220b: Opening
1230: Gas inlet port
1300: Reaction chamber
1310: $Al_2O_3$ substrate
1320, 1330: Gas inlet port
1340: Gas outlet port
1400: Heater
1500: Nitrogen gas supply unit
1600: Argon gas supply unit
A10: $ZrO_2$ sensor
A20: Catalytic converter
A30: Automotive windowpane

The invention claimed is:

1. A method for producing AlN whiskers, the method comprising:
    heating an Al-containing material in a first chamber to thereby generate Al gas;
    introducing the Al gas into a second chamber through a first inlet port while introducing nitrogen gas into the second chamber through a second inlet port; and
    growing AlN whiskers on the surface of an insulating substrate placed in the second chamber.

2. A method for producing AlN whiskers according to claim 1, wherein
    the insulating substrate is any of an $Al_2O_3$ substrate, an AlN polycrystalline substrate, $Al_2O_3$ particles, and AlN particles.

3. A method for producing AlN whiskers according to claim 1,
    wherein the atmosphere temperature in the second chamber is adjusted to 1,500° C. to 1,800° C. during growth of AlN whiskers.

4. A method for producing AlN whiskers, the method comprising:
    heating an Al-containing material in a first chamber to thereby generate Al gas;
    introducing the Al gas into a second chamber through a first inlet port while introducing nitrogen gas into the second chamber through a second inlet port;
    growing a fibrous AlN single crystal on the surface of an insulating substrate placed in the second chamber;
    forming an oxygen atom-containing layer on the surface of the AlN single crystal; and
    forming a hydrocarbon group on the surface of the oxygen atom-containing layer.

5. A method for producing AlN whiskers according to claim 4, wherein,
    in formation of the hydrocarbon group, the method comprises mixing the AlN single crystal comprising the oxygen atom-containing layer with stearic acid and cyclohexane, and refluxing the resultant mixture.

* * * * *